(12) United States Patent
Kang et al.

(10) Patent No.: US 9,530,706 B2
(45) Date of Patent: Dec. 27, 2016

(54) SEMICONDUCTOR DEVICES HAVING HYBRID STACKING STRUCTURES AND METHODS OF FABRICATING THE SAME

(71) Applicant: SAMSUNG ELECTRONICS CO., LTD., Suwon-si, Gyeonggi-do (KR)

(72) Inventors: Pil-Kyu Kang, Gyeonggi-do (KR); Byung Lyul Park, Seoul (KR); Taeyeong Kim, Gyeonggi-do (KR); Yeun-Sang Park, Gyeonggi-do (KR); Dosun Lee, Gwangju (KR); Ho-Jin Lee, Seoul (KR); Jinho Chun, Seoul (KR); Ju-il Choi, Gyeonggi-do (KR); Yi Koan Hong, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/669,291

(22) Filed: Mar. 26, 2015

(65) Prior Publication Data
US 2015/0279825 A1 Oct. 1, 2015

(30) Foreign Application Priority Data
Mar. 26, 2014 (KR) ........................ 10-2014-0035382

(51) Int. Cl.
*H01L 25/065* (2006.01)
*H01L 21/66* (2006.01)
(Continued)

(52) U.S. Cl.
CPC .............. *H01L 22/32* (2013.01); *H01L 24/94* (2013.01); *H01L 25/0657* (2013.01);
(Continued)

(58) Field of Classification Search
CPC ...... H01L 22/32; H01L 25/18; H01L 25/0657; H01L 24/94; H01L 21/76898; H01L 2225/06541; H01L 23/3128; H01L 2225/06596; H01L 2224/0557; H01L 2924/10253; H01L 2224/0401; H01L 2224/06181; H01L 2225/06517; H01L 2224/94

See application file for complete search history.

(56) References Cited

U.S. PATENT DOCUMENTS 5,879,964 A  3/1999  Paik et al.
5,915,167 A  6/1999  Leedy
(Continued)

FOREIGN PATENT DOCUMENTS

JP   2012238704   12/2012
KR   20020024624   4/2002
(Continued)

*Primary Examiner* — David Vu
(74) *Attorney, Agent, or Firm* — F. Chau & Associates, LLC

(57) ABSTRACT

A semiconductor device having a chip stack and an interconnection terminal is provided. The chip stack includes a first semiconductor chip, a second semiconductor chip and a third semiconductor chip stacked on each other. The interconnection terminal is electrically coupled to the chip stack. The first semiconductor chip includes a first front surface and a first backside surface. The second semiconductor chip includes a second front surface, a second backside surface, a second circuit layer and a through-electrode which is electrically coupled to the second circuit layer and penetrates the second semiconductor chip. The third semiconductor chip includes a third front surface, a third backside surface opposite to the third front surface and a third circuit layer adjacent to the third front surface. The first front surface and the second front surface face each other. The third front surface and the second backside surface face each other.

17 Claims, 34 Drawing Sheets

(51) Int. Cl.
*H01L 25/00* (2006.01)
*H01L 23/00* (2006.01)
*H01L 25/18* (2006.01)
*H01L 21/768* (2006.01)
*H01L 23/31* (2006.01)
*H01L 21/56* (2006.01)

(52) U.S. Cl.
CPC ............. *H01L 25/18* (2013.01); *H01L 25/50* (2013.01); *H01L 21/561* (2013.01); *H01L 21/76898* (2013.01); *H01L 23/3128* (2013.01); *H01L 2224/0401* (2013.01); *H01L 2224/0557* (2013.01); *H01L 2224/06181* (2013.01); *H01L 2224/16145* (2013.01); *H01L 2224/16225* (2013.01); *H01L 2224/94* (2013.01); *H01L 2225/06513* (2013.01); *H01L 2225/06517* (2013.01); *H01L 2225/06541* (2013.01); *H01L 2225/06558* (2013.01); *H01L 2225/06565* (2013.01); *H01L 2225/06596* (2013.01); *H01L 2924/10253* (2013.01); *H01L 2924/14* (2013.01); *H01L 2924/1431* (2013.01); *H01L 2924/1434* (2013.01); *H01L 2924/15311* (2013.01); *H01L 2924/181* (2013.01)

(56) References Cited

U.S. PATENT DOCUMENTS

| | | | |
|---|---|---|---|
| 6,642,081 | B1 | 11/2003 | Patti |
| 7,012,011 | B2 | 3/2006 | Chrysler et al. |
| 7,344,959 | B1 | 3/2008 | Pogge et al. |
| 7,494,845 | B2 | 2/2009 | Hwang et al. |
| 7,507,637 | B2 | 3/2009 | Suh et al. |
| 7,781,235 | B2 | 8/2010 | Luo et al. |
| 8,253,232 | B2 | 8/2012 | Kim et al. |
| 8,691,664 | B2 | 4/2014 | Yang et al. |
| 9,167,694 | B2 * | 10/2015 | Sundaram ......... H01L 21/76898 |
| 2005/0110131 | A1 | 5/2005 | Lee |

FOREIGN PATENT DOCUMENTS

| | | |
|---|---|---|
| KR | 1020060063293 | 6/2006 |
| KR | 20090092025 | 8/2009 |
| KR | 20100065973 | 6/2010 |

* cited by examiner

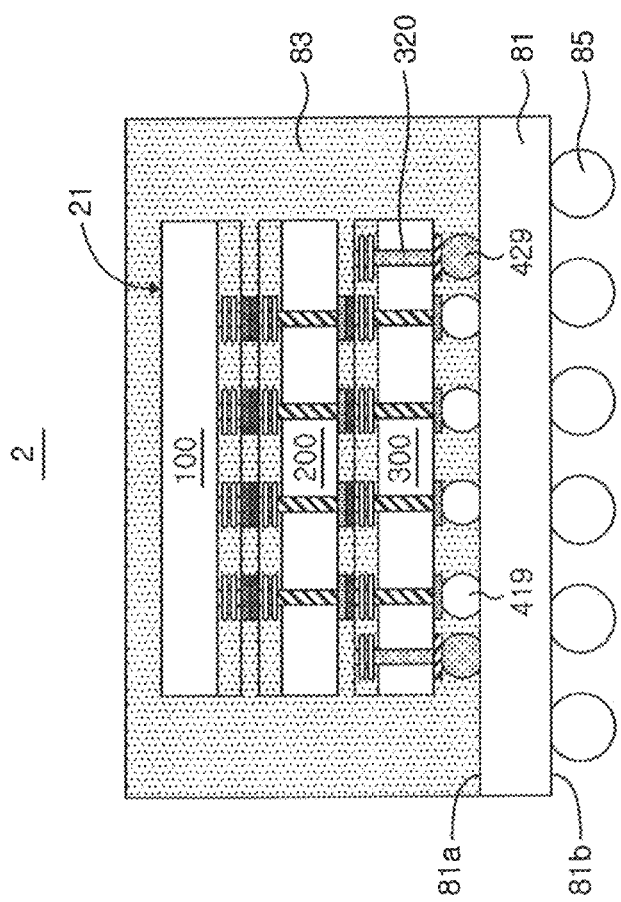

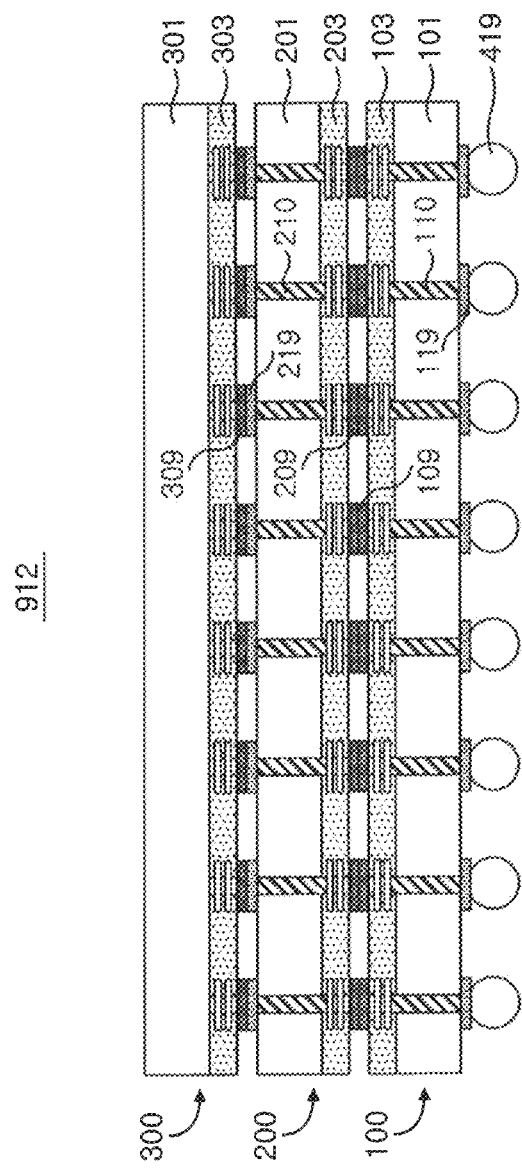

SEMICONDUCTOR DEVICES HAVING HYBRID STACKING STRUCTURES AND METHODS OF FABRICATING THE SAME

CROSS-REFERENCE TO RELATED APPLICATIONS

This application claims priority under 35 U.S.C. §119 to Korean Patent Application 10-2014-0035382, filed on Mar. 26, 2014 in the Korean Intellectual Property Office, the disclosure of which is incorporated by reference herein in its entirety.

TECHNICAL FIELD

The present inventive concept relates to semiconductor devices having hybrid stacking structures and methods of fabricating the same.

DISCUSSION OF RELATED ART

Vertically stacking of at least two or more semiconductor chips is used to increase storage capacity or integrate various kinds of semiconductor chips in a single package.

SUMMARY

According to an exemplary embodiment of the present inventive concept, a method of fabricating a semiconductor device is provided. A first semiconductor chip and a second semiconductor chip are stacked on each other. The first semiconductor chip includes a first front surface, a first backside surface opposite to the first front surface and a first circuit layer adjacent to the first front surface. The second semiconductor chip includes a second front surface, a second backside surface opposite to the second front surface, a second circuit layer adjacent to the second front surface and a through-electrode which is electrically coupled to the second circuit layer and spaced apart from the second backside surface. The first front surface and the second front surface face each other. The second backside surface is grinded to expose the through-electrode of the second semiconductor chip. The first backside surface is grinded so that the first semiconductor chip has a first reduced thickness. A third semiconductor chip is stacked on the grinded second backside surface. The third semiconductor chip includes a third front surface, a third backside surface opposite to the third front surface and a third circuit layer adjacent to the third front surface. The third front surface and the grinded second backside surface face each other. The third backside surface is grinded to reduce a thickness of the third semiconductor chip. The grinded first backside surface is grinded so that the first semiconductor chip has a second reduced thickness smaller than the first reduced thickness.

According to an exemplary embodiment of the present inventive concept, a semiconductor device having a chip stack and an interconnection terminal is provided. The chip stack includes a first semiconductor chip, a second semiconductor chip and a third semiconductor chip stacked on each other. The interconnection terminal is electrically coupled to the chip stack. The first semiconductor chip includes a first front surface, a first backside surface opposite to the first front surface and a first circuit layer adjacent to the first front surface. The second semiconductor chip includes a second front surface, a second backside surface opposite to the second front surface, a second circuit layer adjacent to the second front surface and a through-electrode which is electrically coupled to the second circuit layer and penetrates the second semiconductor chip. The third semiconductor chip includes a third front surface, a third backside surface opposite to the third front surface and a third circuit layer adjacent to the third front surface. The first front surface and the second front surface face each other. The third front surface and the second backside surface face each other.

According to an exemplary embodiment of the present inventive concept, a method of fabricating a semiconductor device is provided. A first semiconductor chip and a second semiconductor chip is provided. Each semiconductor chip includes a front surface and a backside surface opposite to the front surface. The first and second semiconductor chips are stacked such that corresponding front surfaces face each other. The backside surface of the second semiconductor chip is grinded to reduce a thickness thereof. A third semiconductor chip is stacked on the grinded backside surface of the second semiconductor chip. The third semiconductor chip includes a front surface and a backside surface opposite to the front surface thereof. The third semiconductor chip is stacked such that the front surface of the third semiconductor chip faces the grinded backside surface of the second semiconductor chip. The backside surface of the third semiconductor chip is grinded to reduce a thickness thereof.

BRIEF DESCRIPTION OF THE DRAWINGS

These and other features of the inventive concept will become more apparent by describing in detail exemplary embodiments thereof with reference to the accompanying drawings of which:

FIG. 2G is a cross-sectional view illustrating a semiconductor package including a semiconductor device according to an exemplary embodiment of the present inventive concepts;

FIGS. 3A to 3G are cross-sectional views illustrating a method of fabricating a semiconductor device according to an exemplary embodiment of the present inventive concept;

DETAILED DESCRIPTION OF EXEMPLARY EMBODIMENTS

Figure 1A:
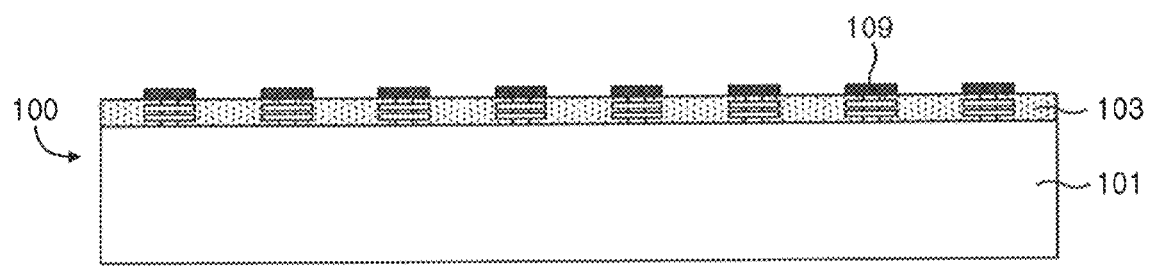
FIGS. 1A to 1I are cross-sectional views illustrating a method for fabricating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1A to 1I are cross-sectional views illustrating a method of fabricating a semiconductor device according to an exemplary embodiment of the present inventive concept. FIG. 1J is a cross-sectional view of an exemplary embodiment of FIG. 1I. FIG. 1K is a cross-sectional view illustrating a semiconductor package including a semiconductor device according to an exemplary embodiment of the present inventive concept.

Referring to FIG. 1A, a first semiconductor chip 100 is a wafer-level chip including a first semiconductor substrate 101, a first circuit layer 103 on the first semiconductor substrate 101, and a plurality of front pads 109 on the first circuit layer 103. The first semiconductor substrate 101 may be, for example, a silicon wafer. The first circuit layer 103 may include at least one integrated circuit. For example, the first circuit layer 103 may include single-layered or multi-layered metal lines which electrically connect the integrated circuit to the first front pad 109. The integrated circuit may include a memory circuit, a logic circuit, or a combination thereof. The first front pad 109 may include a metal such as copper, aluminum, or an alloy thereof.

Figure 1B:
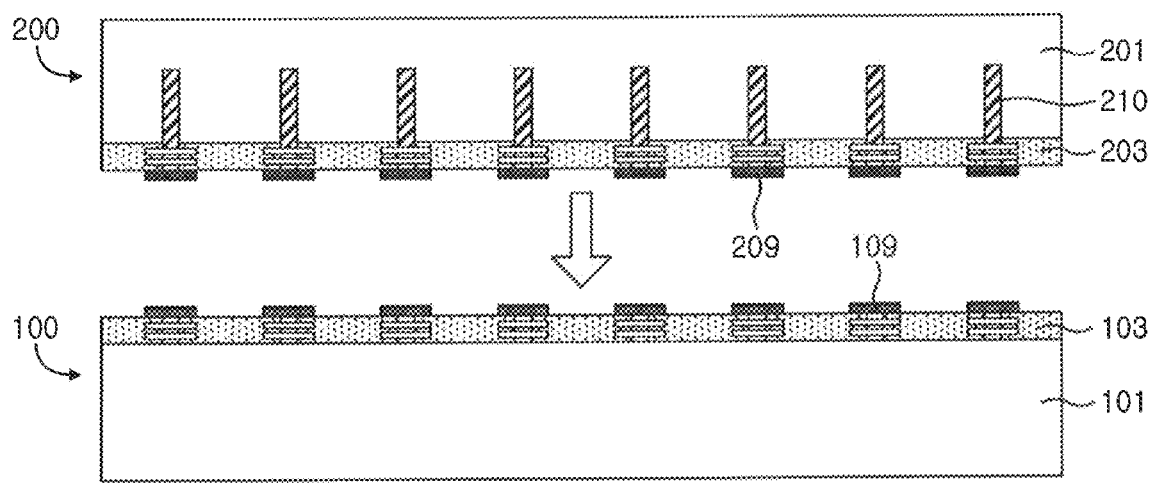

Referring to FIG. 1B, a second semiconductor chip 200 is disposed on the first semiconductor chip 100. The second semiconductor chip 200 is a wafer-level chip including a second semiconductor substrate 201, a second circuit layer 203 on the second semiconductor substrate 201, and a plurality of second front pads 209 on the second circuit layer 203. The second semiconductor substrate 201 may be, for example, a silicon wafer. The second circuit layer 203 may include at least one integrated circuit and single-layered or multi-layered metal lines which electrically connect the integrated circuit to the second front pad 209. The integrated circuit may include a memory circuit, a logic circuit, or a combination thereof. The second front pad 209 may include a metal such as copper, aluminum, or an alloy thereof.

The second semiconductor chip 200 further includes a plurality of second through-electrodes 210 which partially penetrate the second semiconductor substrate 201 and further partially or completely penetrate the second circuit layer 203. The second through-electrode 210 may include a metal such as copper and be electrically insulated from the second semiconductor substrate 201.

The second semiconductor chip 200 is turned upside down and disposed on the first semiconductor chip 100. Consequently, the first and second semiconductor chips 100 and 200 are stacked to constitute a face-to-face structure in which a front surface, which corresponds to the first circuit layer 103, of the first semiconductor chip 100 faces a front surface, which corresponds to the second circuit layer 203, of the second semiconductor chip 200.

Figure 1C:
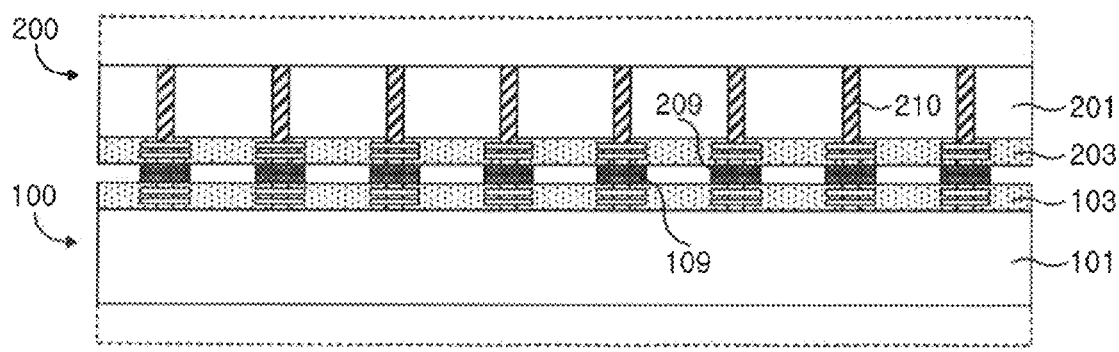

Referring to FIG. 1C, the second semiconductor chip 200 is thinned. For example, a backside surface opposite the front surface of the second semiconductor substrate 201 may be grinded down to the extent that the second through-electrodes 210 may be exposed or may be protruded from the grinded backside surface of the second semiconductor substrate 201. After or before thinning the second semiconductor chip 200, a backside surface of the first semiconductor substrate 101, which is opposite the front surface corresponding to the first circuit layer 103, may be grinded down such that the first semiconductor chip 100 may be thinned.

The thinning processes may reduce a thickness of stacking structure in which the first and second semiconductor chips 100 and 200 are stacked one atop the other.

Figure 1D:
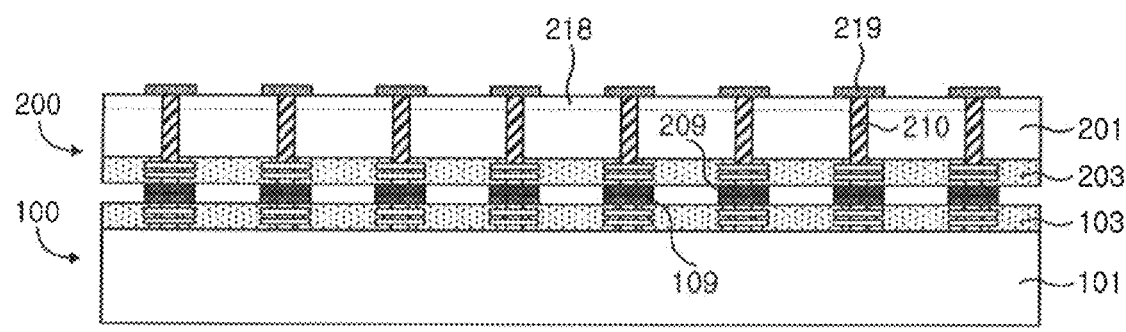

Referring to FIG. 1D, a plurality of second backside pads 219 is formed on the grinded backside surface of the second semiconductor substrate 201 to be connected to the second through-electrodes 210. The second backside pads 219 may include a metal such as copper, aluminum, or an alloy thereof. The second backside pads 219 may be electrically insulated from the second semiconductor substrate 201 and electrically connected to the second through-electrodes 210. Alternatively, the second backside pads 219 may be formed after the thinning of the first semiconductor chip 100.

Before the formation of the second backside pads 219, an insulation layer 218 may be further formed to cover the backside surface of the second semiconductor substrate 201. The insulation layer 218 may electrically insulate the second backside pads 219 from the second semiconductor substrate 201.

The insulation layer 218 may be omitted hereinafter for the sake of brevity. Additional insulation layers may be further formed on front and backside surfaces of semiconductor substrates described herein to electrically insulate the front and backside pads from the semiconductor substrates. The additional insulation layers may also be omitted hereinafter for the sake of brevity.

Figure 1E:
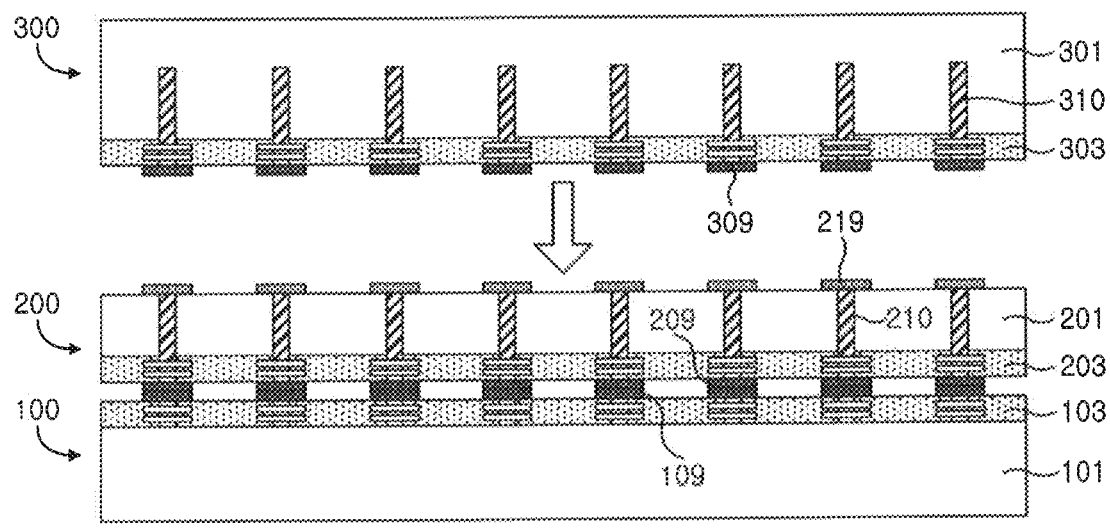

Referring to FIG. 1E, a third semiconductor chip 300 is provided on the second semiconductor chip 200. The third semiconductor chip 300 is a wafer-level chip including a third semiconductor substrate 301, a third circuit layer 303 on the third semiconductor substrate 301, and a plurality of third front pads 309 on the third circuit layer 303. The third semiconductor substrate 301 may be, for example, a silicon wafer. The third circuit layer 303 may include at least one integrated circuit and single-layered or multi-layered metal lines which electrically connect the integrated circuit to the third front pad 309. The integrated circuit may include a memory circuit, a logic circuit, or a combination thereof. The third front pad 309 may include a metal such as copper, aluminum, or an alloy thereof. The third semiconductor chip 300 further includes a plurality of third through-electrodes 310 which partially penetrate the third semiconductor substrate 301 and further partially or completely penetrate the third circuit layer 303. The third through-electrode 310 may include a metal such as copper and be electrically insulated from the third semiconductor substrate 301.

The third semiconductor chip 300 is turned upside down and disposed on the backside surface of the second semiconductor chip 200. As a result, the second and third semiconductor chips 200 and 300 may be stacked to constitute a back-to-face structure in which the backside surface of the second semiconductor chip 200 faces a front surface, which corresponds to the third circuit layer 303, of the third semiconductor chip 300.

Figure 1F:
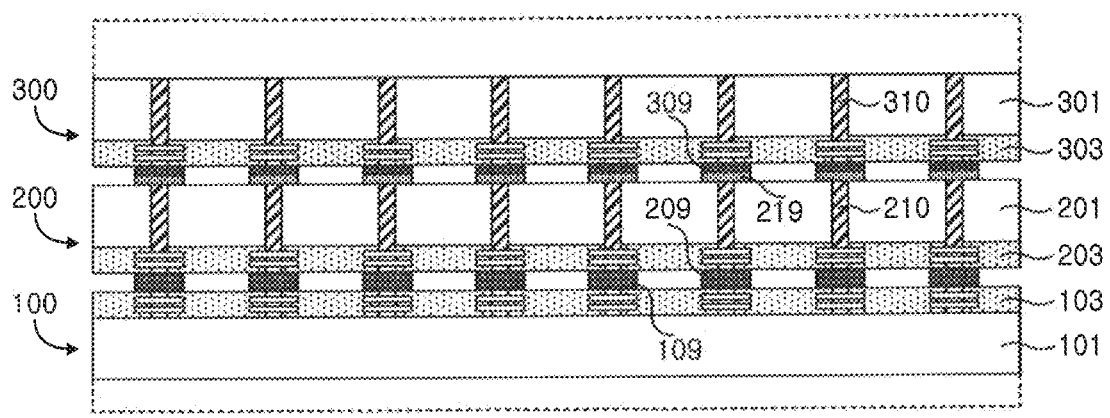

Referring to FIG. 1F, the third semiconductor chip 300 may be thinned. For example, a backside surface opposite the front surface of the third semiconductor substrate 301 may be grinded down to the extent that the third through-electrodes 310 may be exposed or may be protruded from the grinded backside surface of the third semiconductor substrate 301. After or before thinning the third semiconductor chip 300, the backside surface of the first semiconductor substrate 101 may be further grinded down such that the first semiconductor chip 100 may be further thinned.

Figure 1G:
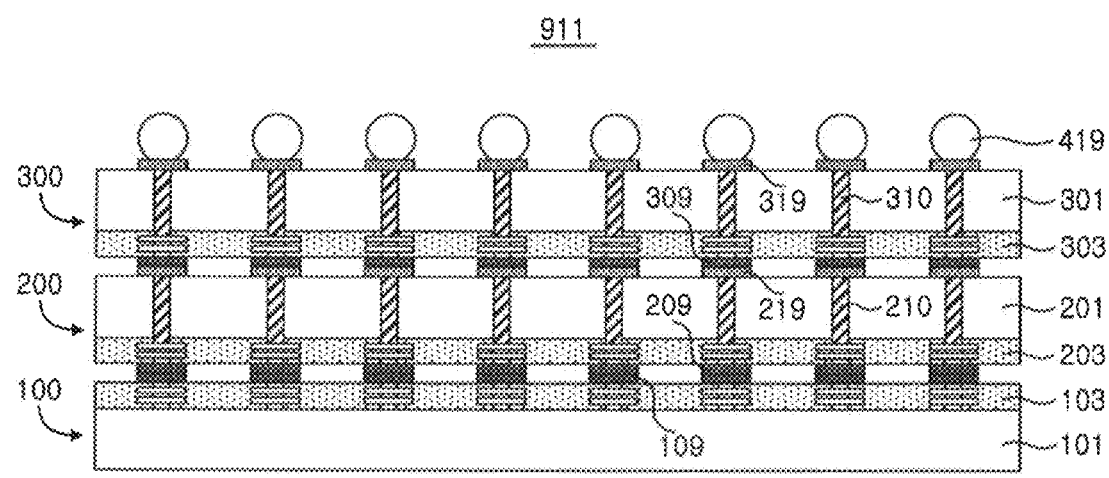

Referring to FIG. 1G, a plurality of third backside pads 319 is formed on the grinded backside surface of the third semiconductor substrate 301 to be connected to the third through-electrodes 310. The third backside pads 319 may include a metal such as copper, aluminum, or an alloy thereof. The third backside pads 319 may be electrically insulated from the third semiconductor substrate 301 and electrically connected to the third through-electrodes 310. A plurality of interconnection terminals 419 such as solder balls is further formed on the third backside pads 319. Alternatively, the plurality of interconnection terminals 419 need not be formed on the third backside pads 319.

Through the afore-mentioned processes, a wafer-level chip stack 911 is formed to include the second semiconductor chip 200 having the second through-electrodes 210 stacked on the first semiconductor chip 100 and the third semiconductor chip 300 having the third through-electrodes 310 stacked on the second semiconductor chip 200.

According to an exemplary embodiment, the second and third semiconductor chips 200 and 300 stacked on the first semiconductor chip 100 may be grinded down to reduce a height or thickness of the chip stack 911. Moreover, the first semiconductor chip 100 may be grinded down at least once and thus the chip stack 911 may have a minimum permissible height or thickness.

Figure 1H:
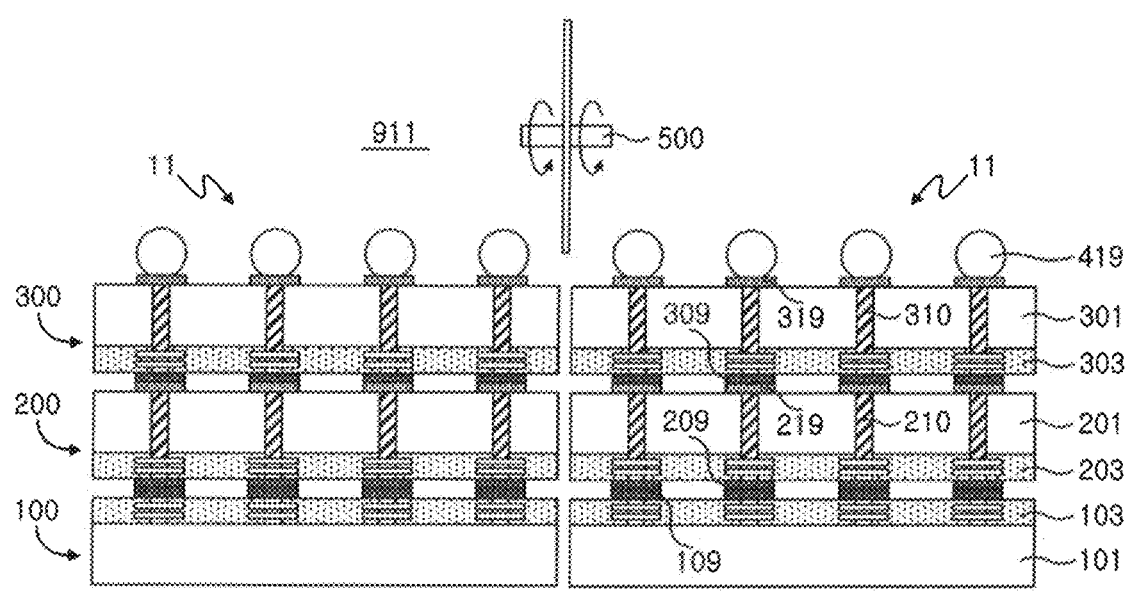

Referring to FIG. 1H, the wafer-level chip stack 911 is divided into a plurality of chip-level semiconductor devices 11. A cutting tool 500 such as a dicing blade or laser is used to cut the chip stack 911, which is divided into the semiconductor devices 11.

Figure 1I:
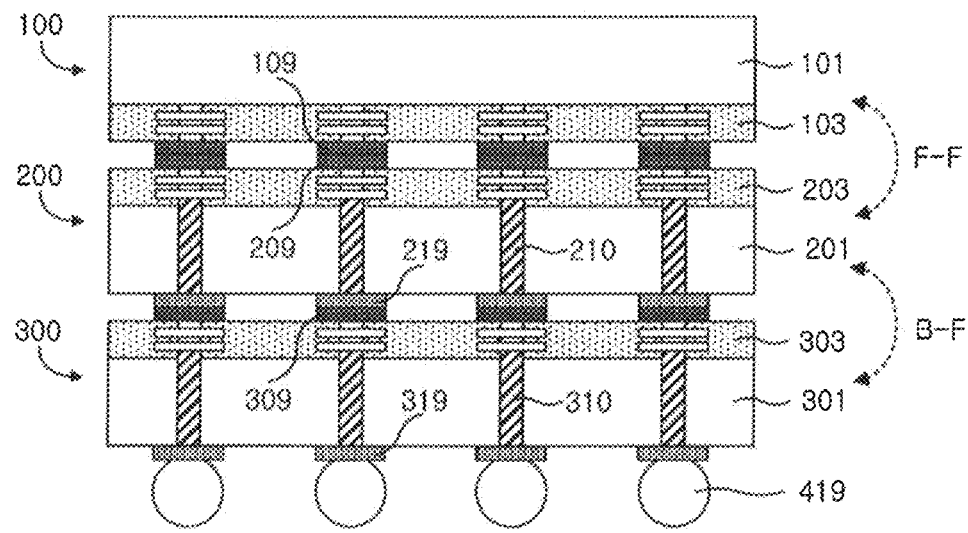
Figure 1J:
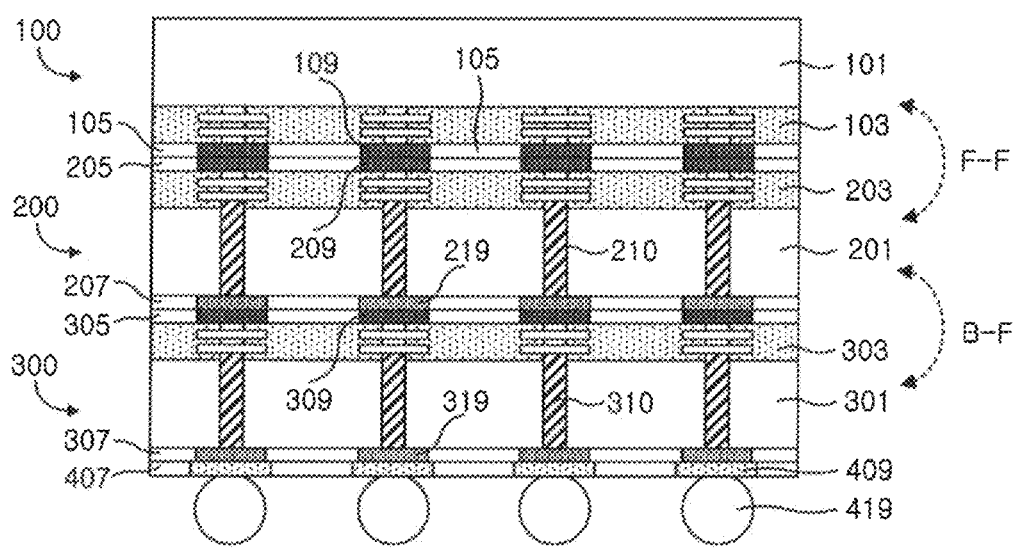
FIG. 1J is a cross-sectional view of an exemplary embodiment of the present inventive concept.
Figure 1K:
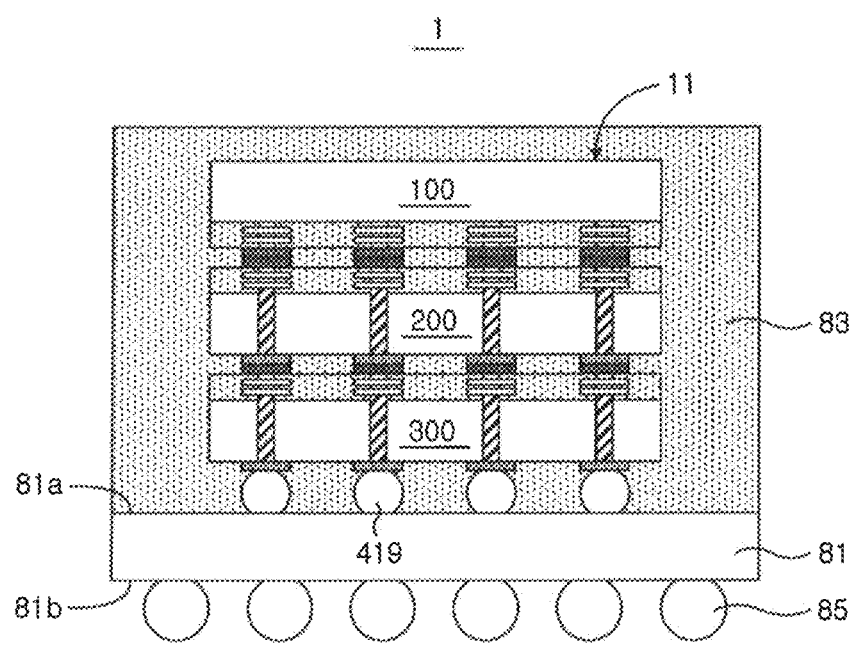
FIG. 1K is a cross-sectional view illustrating a semiconductor package including a semiconductor device according to an exemplary embodiment of the present inventive concept.

Referring to FIG. 1I, the semiconductor device 11 has a hybrid stacking structure having the face-to-face structure F-F in which the front surface of the first semiconductor chip 100 faces the front surface of the second semiconductor chip 200 and the back-to-face structure B-F in which the backside surface of the second semiconductor chip 200 faces the front surface of the third semiconductor chip 300. The third semiconductor chip 300 including the interconnection terminals 419 attached thereto may serve as a master chip of the semiconductor device 11, and the first and second semiconductor chips 100 and 200 may serve as slave chips. For example, the third semiconductor chip 300 serving as the master chip may be a logic chip, and the first and second semiconductor chips 100 and 200 serving as the slave chips may be memory chips.

Alternatively, the first to third semiconductor chips 100, 200 and 300 may be the same type chip, for example, a memory chip.

Referring to FIG. 1J, a semiconductor device 11a is substantially similar to the semiconductor device 11 of FIG. 1I, except that the semiconductor device 11a further includes at least one protection layer and an insulation layer. For the convenience of description, description of the same elements as in the above embodiment will be omitted.

For example, the first semiconductor chip 100 further includes a first front protection layer 105 that covers the front surface of the first semiconductor chip 100 and fills spaces between the first front pads 109. The second semiconductor chip 200 further includes a second front protection layer 205 that covers the front surface of the second semiconductor chip 200 and fills spaces between the second front pads 209 and a second backside protection layer 207 that covers the backside surface of the second semiconductor chip 200 and fills spaces between the second backside pads 219. The third semiconductor chip 300 further includes a third front protection layer 305 that covers the front surface of the third semiconductor chip 300 and fills spaces between the third front pads 309 and a third backside protection layer 307 that covers the backside surface of the third semiconductor chip 300 and fills spaces between the third backside pads 319. The first to third front pads 109, 209 and 309 may be formed by a damascene process. Similarly, the second and third backside pads 219 and 319 may be formed by a damascene process.

The semiconductor device 11a further includes an insulation layer 407 that covers the third backside protection layer 307 and fills spaces between metal layers 409. The interconnection terminals 419 are coupled to the metal layers 409 to be electrically connected to the third backside pads 319.

Referring to FIG. 1K, the semiconductor device 11 is packaged to form a semiconductor package 1. For example, the semiconductor device 11 is mounted on a top surface 81a of a package substrate 81 such as a printed circuit board and encapsulated by a mold layer 83. A plurality of outer terminals 85 such as solder balls is attached to a bottom surface 81b of the package substrate 81. The interconnection terminals 419 may electrically connect the semiconductor device 11 to the package substrate 81. Alternatively, the semiconductor package 1 may include the semiconductor device 11a instead of the semiconductor device 11.

FIGS. 2A to 2E are cross-sectional views illustrating a method of fabricating a semiconductor device according to an exemplary embodiment of the present inventive concept. FIG. 2F is a cross-sectional view illustrating a semiconductor device as an alternative embodiment to the semiconductor device 21 of FIG. 2E. FIG. 2G is a cross-sectional view illustrating a semiconductor package including a semiconductor device according to an exemplary embodiment of the present inventive concept.

Figure 2A:
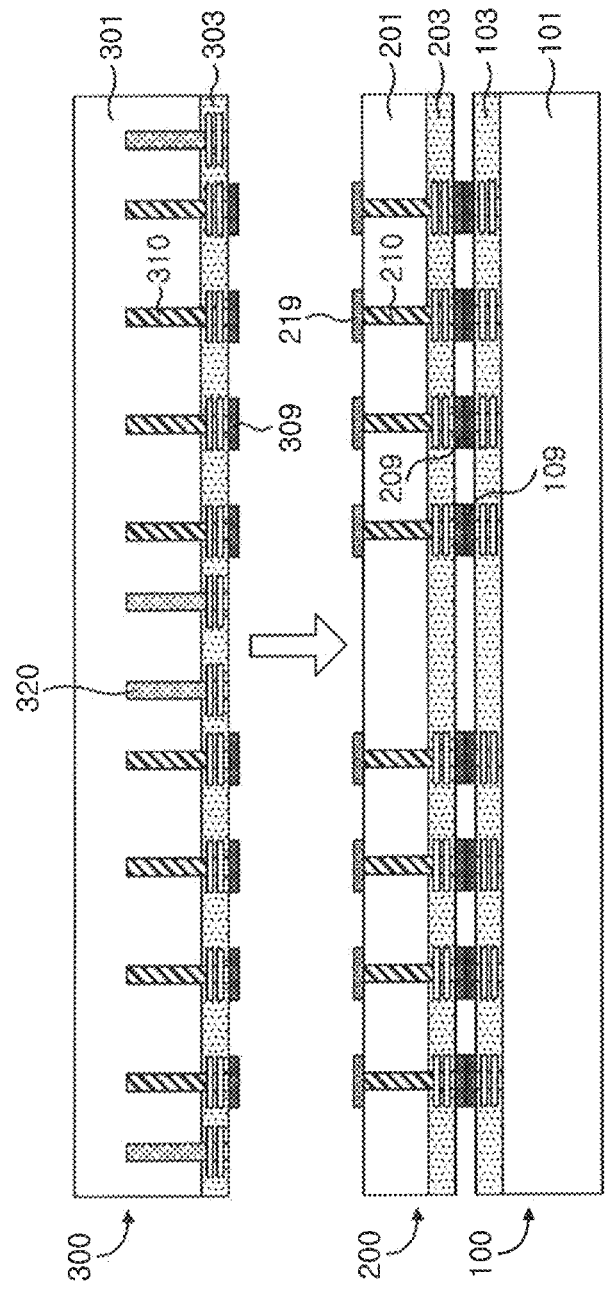
FIGS. 2A to 2E are cross-sectional views illustrating a method of fabricating a semiconductor device according to an exemplary embodiment of the present inventive concept.

Referring to FIG. 2A, the first and second semiconductor chips 100 and 200 are stacked to constitute the face-to-face structure, and the third semiconductor chip 300 is stacked on the second semiconductor chip 200 to constitute the back-to-front structure by processes substantially identical or similar to those described with reference to FIGS. 1A to 1D.

For example, as illustrated in FIGS. 1A and 1B, the second wafer-level semiconductor chip 200 having the second through-electrodes 210 is stacked on the first wafer-level semiconductor chip 100 to constitute the face-to-face structure. As illustrated in FIG. 1C, the backside surface of the second semiconductor substrate 201 may be grinded down to expose or protrude the second through-electrodes 210, and then the backside surface of the first semiconductor substrate 101 may be grinded down. As shown in FIG. 1D, the second backside pads 219 is formed on the grinded backside surface of the second semiconductor substrate 201 to be connected to the second through-electrodes 210.

The third semiconductor chip 300 further includes a plurality of test electrodes 320. The test electrodes 320 are formed together with the third through-electrodes 310. The test electrodes 320 partially penetrate the third semiconductor substrate 301 and further partially or completely penetrate the third circuit layer 303. The third semiconductor chip 300 does not have pads which are connected to the test electrodes 320.

Figure 2B:
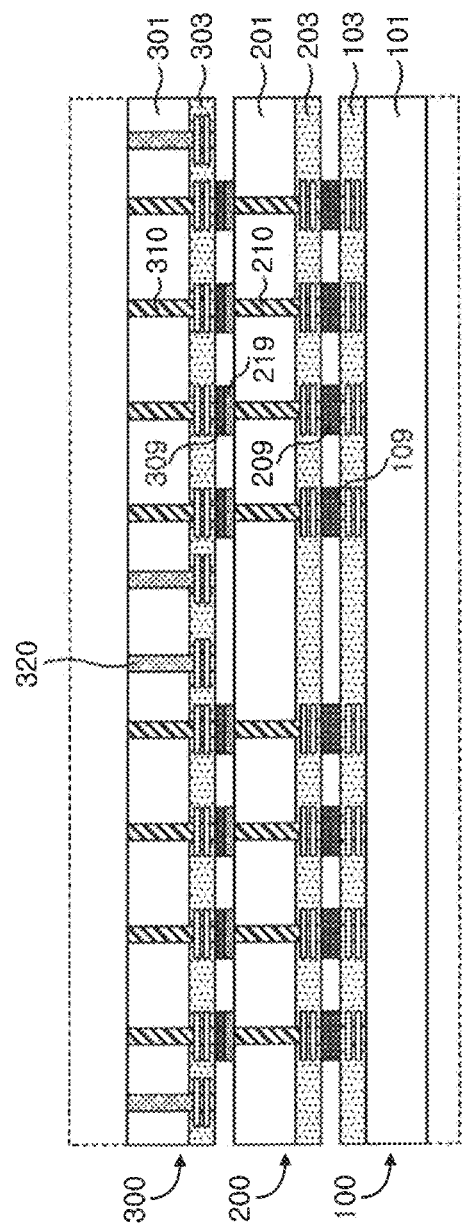

Referring to FIG. 2B, the third semiconductor chip 300 is thinned. For example, the backside surface of the third semiconductor substrate 301 may be grinded down to expose the third through-electrodes 320 and the test electrodes 320. After or before thinning the third semiconductor chip 300, the backside surface of the first semiconductor substrate 101 may be further grinded down to further thin the first semiconductor chip 100.

Figure 2C:
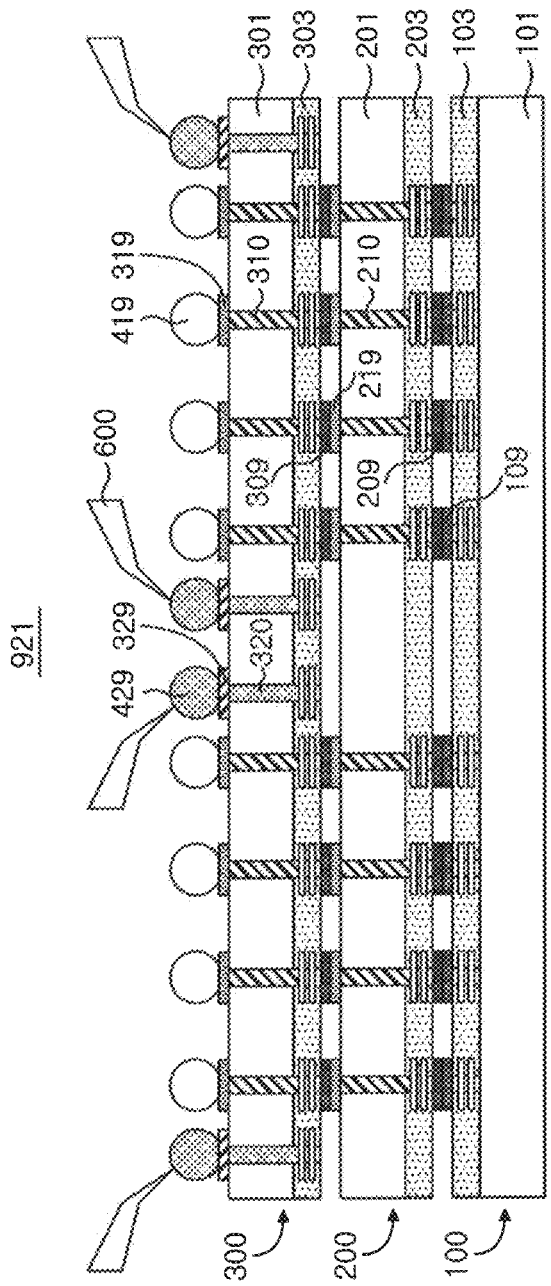

Referring to FIG. 2C, the third backside pads 319 are formed on the grinded third backside surface of the third semiconductor substrate 301 to be connected to the third through-electrodes 310. When the third backside pads 319 are formed, a plurality of test pads 329 is further formed to be connected to the test electrodes 320. The interconnection terminals 419 are further formed to be coupled to the third backside pads 319. A plurality of test terminals 429 is further formed to be coupled to the test pads 329.

Through afore-mentioned processes, a wafer-level chip stack 921 is formed to include the second semiconductor chip 200 having the second through-electrodes 210 on the first semiconductor chip 100 and the third semiconductor chip 300 having the third through-electrodes 310 and the test electrodes 320 on the second semiconductor chip 200.

A probe 600 contacts the test terminals 429 to electrically inspect the chip stack 921. Alternatively, in a case that the test terminals 429 are not provided, the probe 600 may contact the test pad 329 to electrically inspect the chip stack 921. The chip stack 921 further includes the test electrodes 320, the test pads 329 and the test terminals 429 such that the electrical inspection of the chip stack 921 may be available without physical damages of the interconnection terminals 419 and the third backside pads 319.

Figure 2D:
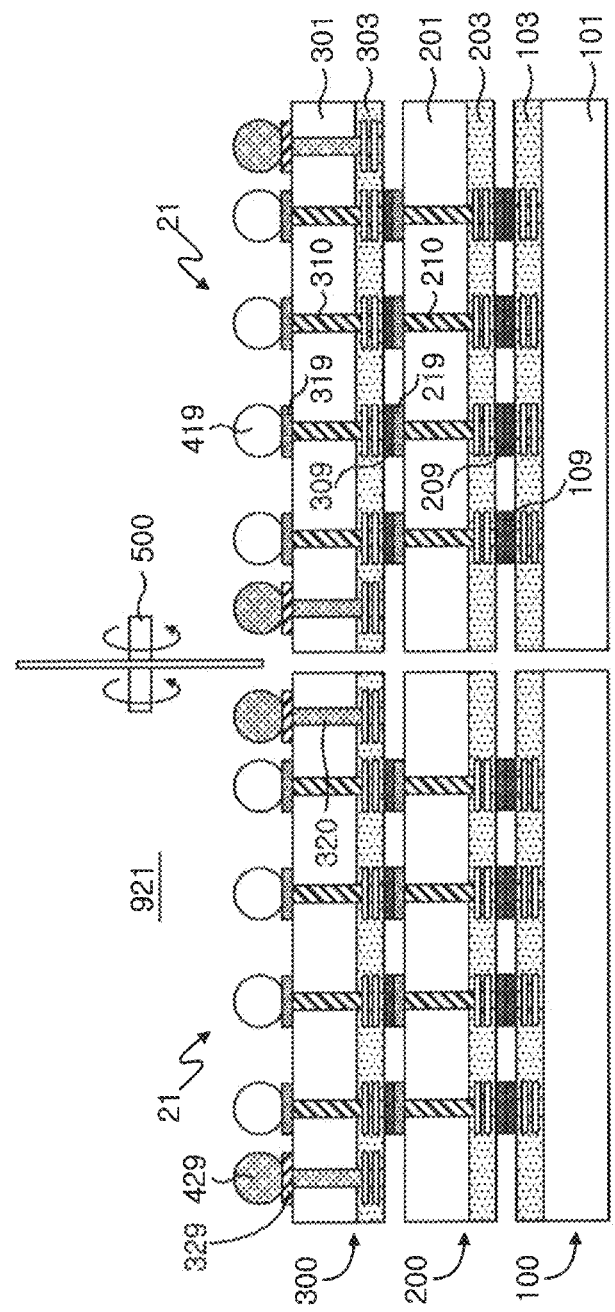

Referring to FIG. 2D, a dicing process is performed using the cutting tool 500 capable of dividing the chip stack 921 into a plurality of chip-level semiconductor devices 21.

Figure 2E:
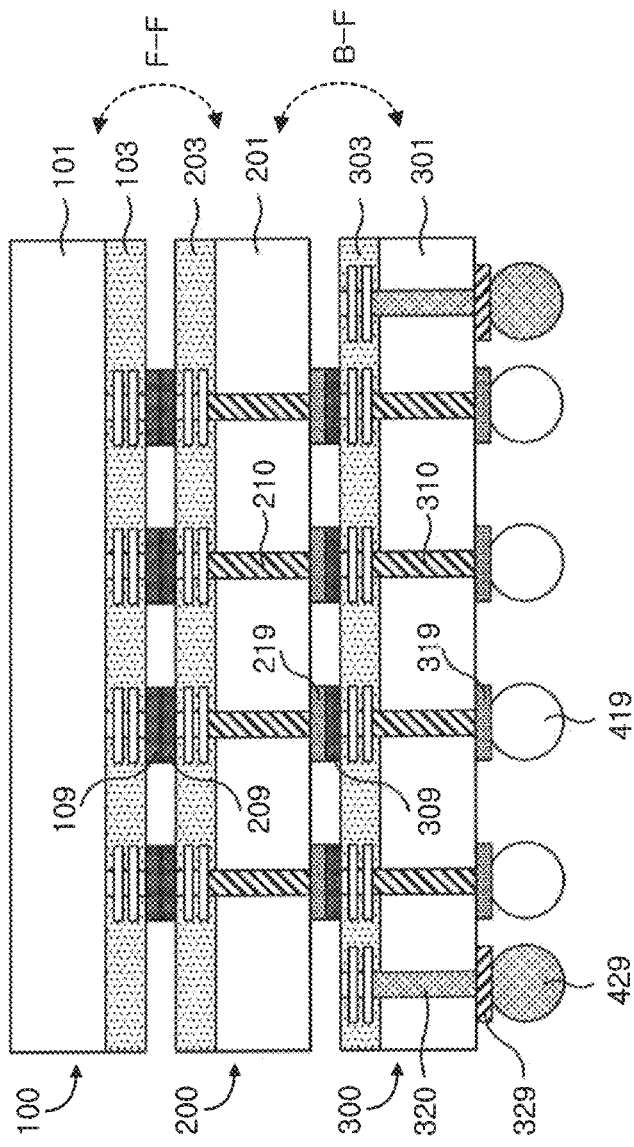
Figure 2F:
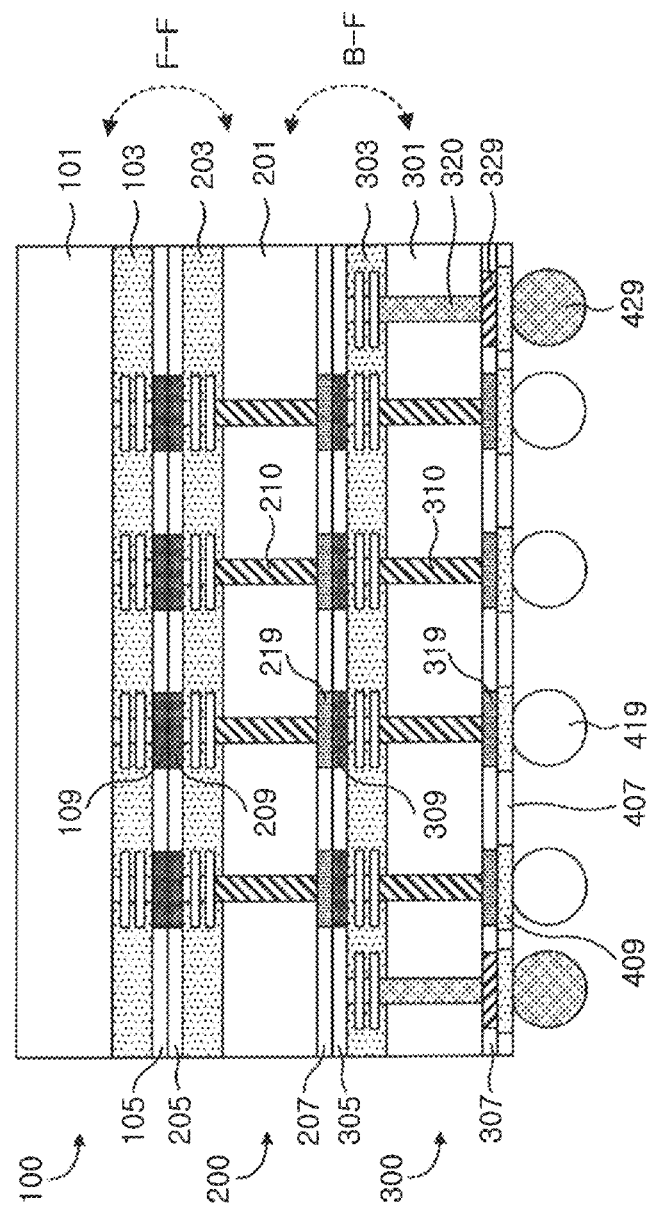
FIG. 2F is a cross-sectional view illustrating a semiconductor device according to an exemplary embodiment of the present inventive concept.

Referring to FIG. 2E, the semiconductor device 21 formed by the dicing process includes a hybrid structure having the face-to-face structure of the first and second semiconductor chips 100 and 200, and the back-to-face structure of the second and third semiconductor chips 200 and 300. The third semiconductor chip 300 to which the interconnection terminals 419 are attached may serve as a master chip, and the first and second semiconductor chips 100 and 200 may serve as slave chips. The test electrodes 320 may serve as repair electrodes which may replace any defective third through-electrodes 310. For example, the third semiconductor chip 300 may be a logic chip as the master chip, and the first and second semiconductor chips 100 and 200 may be memory chips as the slave chips.

The first to third semiconductor chips 100, 200 and 300 may be the same type of chip, for example, a memory chip.

Referring to FIG. 2F, a semiconductor device 21a is substantially similar to the semiconductor device 21 of FIG. 2E except that the semiconductor device 21a includes at least one protection layer and an insulation layer.

For example, the first semiconductor chip 100 further includes the first front protection layer 105 that covers the front surface thereof. The second semiconductor chip 200 further includes the second front protection layer 205 that covers the front surface thereof and the second backside protection layer 207 that covers the backside surface thereof. The third semiconductor chip 300 further includes the third front protection layer 305 that covers the front surface thereof and the third backside protection layer 307 that covers the backside surface thereof. The first to third front pads 109, 209 and 309 may be formed by a damascene process. Similarly, the second and third backside pads 219 and 319 and the test pads 329 may each be formed by a damascene process.

The semiconductor device 21a further includes the insulation layer 407 that covers the third backside protection layer 307 and the metal layers 409 that are connected to the third backside pads 319 and the test pads 329. The interconnection terminals 419 are coupled to the metal layers 409 to be electrically connected to the third backside pads 319. The test terminals 429 are coupled to the metal layers 409 to be electrically connected to the test electrodes 320.

Referring to FIG. 2G, the semiconductor device 21 is packaged to form a semiconductor package 2. For example, the semiconductor device 21 is mounted on the top surface 81a of the package substrate 81, and the mold layer 83 is formed to encase the semiconductor device 21. The external terminals 85 are attached to the bottom surface 81b of the package substrate 81. The interconnection terminals 419 are electrically connect the semiconductor device 21 to the package substrate 81. Instead of the semiconductor device 21, the semiconductor device 21a may be mounted on the package substrate 81 to form the semiconductor package 2.

The test terminals 429 need not be electrically connected to the package substrate 81. In this case, the test terminals 429 may serve as mechanical supporters that sustain the semiconductor device 21 on the package substrate 81. Alternatively, in case that at least one of the test electrodes 420 is used for repair, at least one of the test terminals 429 which is coupled to the at least one of the test electrodes 420 used for repair may be electrically connected to the package substrate 81. The test terminals 429 are electrically connected to the package substrate 81.

FIGS. 3A to 3G are cross-sectional views illustrating a method of fabricating a semiconductor device according to an exemplary embodiment of the present inventive concept. FIGS. 3H to 3J are cross-sectional views semiconductor devices as alternative examples to the semiconductor device 12 of FIG. 3G.

Figure 3A:
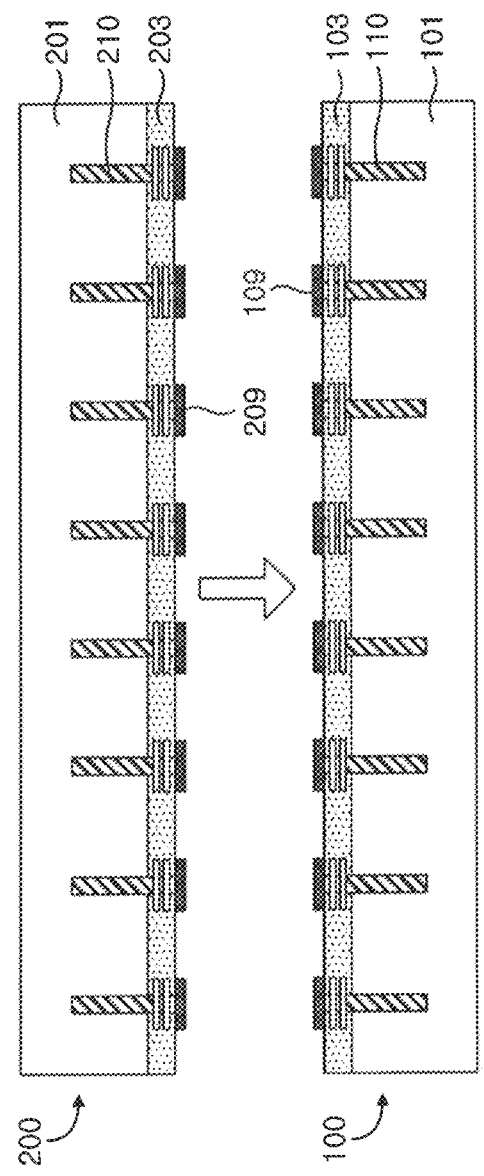

Referring to FIG. 3A, the second wafer-level semiconductor chip 200 having the second through-electrodes 210 is stacked on the first wafer-level semiconductor chip 100 to constitute the face-to-face structure by processes substantially identical or similar to those described with reference to FIGS. 1A and 1B. The first semiconductor chip 100 includes the first circuit layer 103 disposed on the first semiconductor substrate 101, a plurality of first through-electrodes 110 which partially penetrates the first semiconductor substrate 101, and the first front pads 109 disposed on the first circuit layer 103.

Figure 3B:
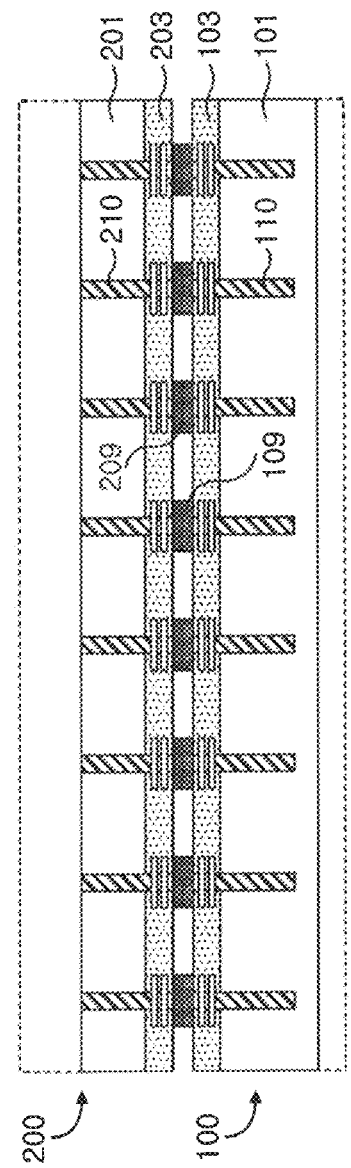

Referring to FIG. 3B, the backside surface of the second semiconductor substrate 201 may be grinded down to expose the second through-electrodes 210, and the second semiconductor chip 200 is thinned. After or before thinning the second semiconductor chip 200, the backside surface of the first semiconductor substrate 101 may be grinded down to thin the first semiconductor chip 100. The backside surface of the first semiconductor substrate 101 may be grinded down without exposing the first through-electrodes 110. Alternatively, the backside grinding of the first semiconductor substrate 101 may allow the first through-electrodes 110 to be exposed through the grinded backside surface of the first semiconductor substrate 101 or to be protruded from the grinded backside surface of the first semiconductor substrate 101.

Figure 3C:
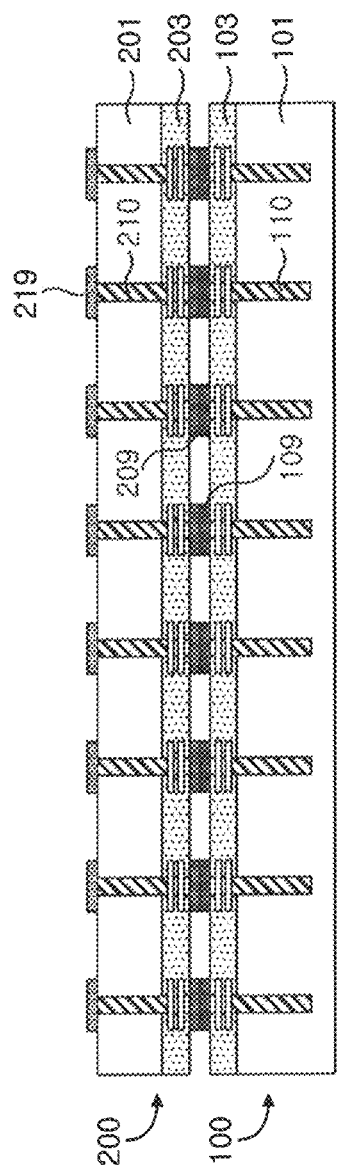

Referring to FIG. 3C, the second backside pads 219 are formed on the grinded second backside surface of the second semiconductor substrate 201 to be electrically connected to the second through-electrodes 210. The second backside pads 219 may include metal layers, which contain copper, aluminum or an alloy thereof, electrically insulated from the second semiconductor substrate 201.

Figure 3D:
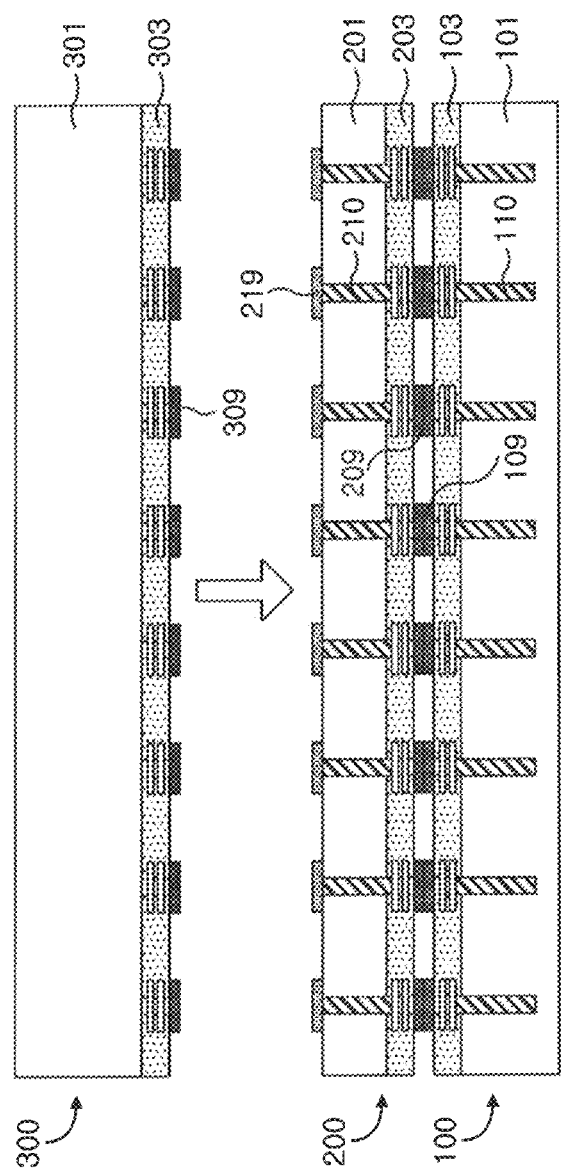

Referring to FIG. 3D, the third wafer-level semiconductor chip 300 is disposed on the second semiconductor chip 200. The third semiconductor chip 300 includes the third circuit layer 303 disposed on the third semiconductor substrate 301, and the third front pads 309 disposed on the third circuit layer 303. The third semiconductor chip 300 does not include the third through-electrodes 310 of FIG. 1E.

Figure 3E:
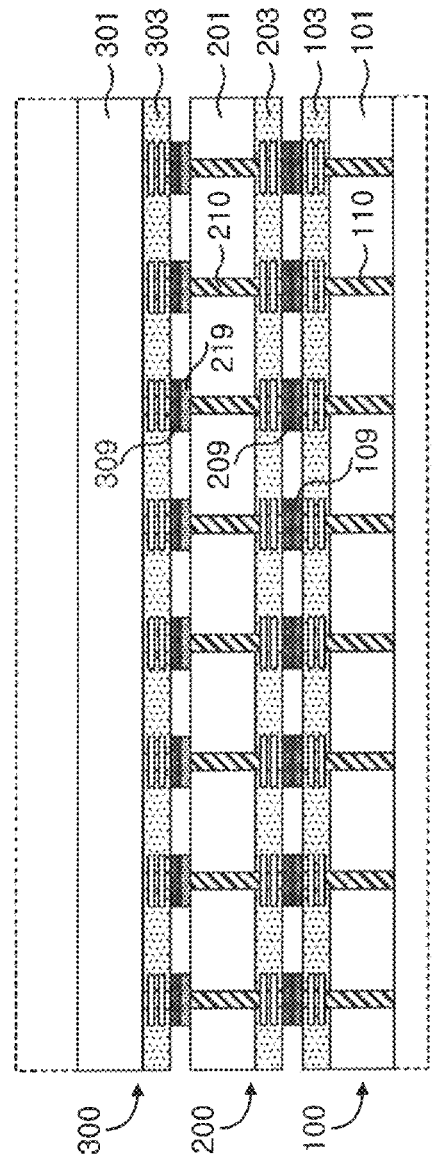

Referring to FIG. 3E, the backside surface of the third semiconductor substrate 301 may be grinded down to thin the third semiconductor chip 300. After of before thinning the third semiconductor chip 300, the backside surface of the first semiconductor substrate 101 may be further grinded down to further thin the first semiconductor chip 100. This additional thinning of the first semiconductor chip 100 exposes or protrudes the first through-electrodes 110 from the twice grinded backside surface of the first semiconductor substrate 101.

Referring to FIG. 3F, the first backside pads 119 are formed on the backside surface of the first semiconductor substrate 101 to be electrically connected to the first through-electrodes 110. The first backside pads 119 may include metal layers which contain copper, aluminum or an alloy thereof. The first backside pads 119 may be electrically insulated from the first semiconductor substrate 101 and electrically connected to the first through-electrodes 110. The interconnection terminals 419 are further formed to be coupled to the first backside pads 119.

Through afore-mentioned processes, a wafer-level chip stack 912 is formed to include the second semiconductor chip 200 having the second through-electrodes 210 on the first semiconductor chip 100 and the third semiconductor chip 300 without the third through-electrodes on the second semiconductor chip 200.

Figure 3G:
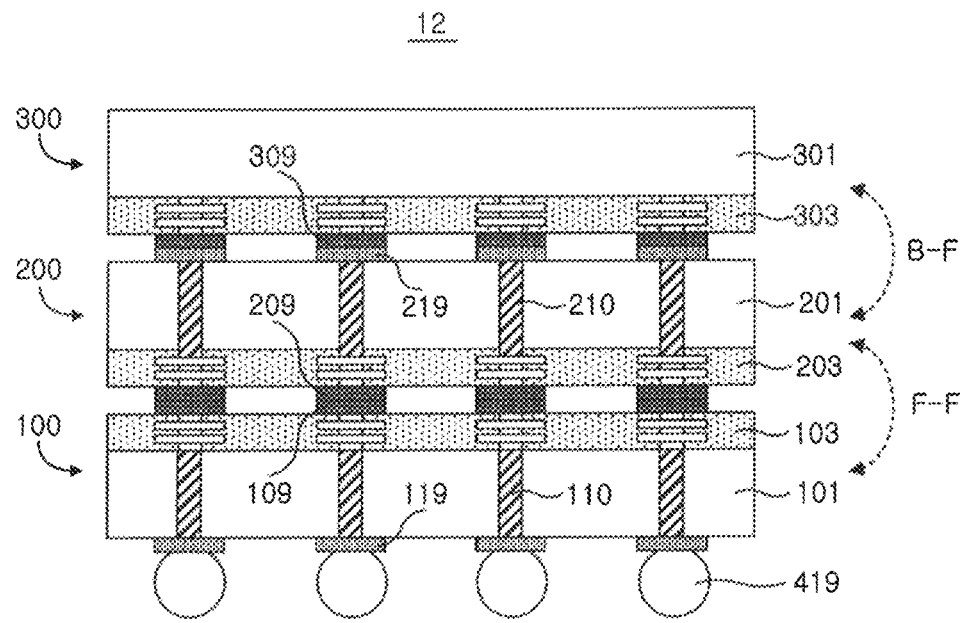
Figure 3H:
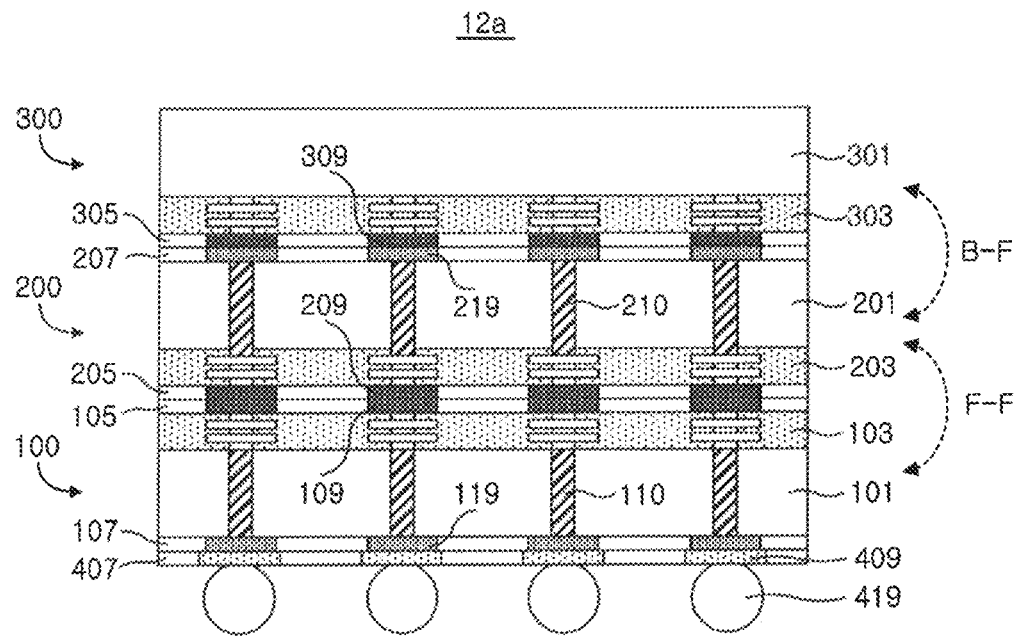
FIGS. 3H to 3J are cross-sectional views of semiconductor devices according to an exemplary embodiment of the present inventive concept.
Figure 3I:
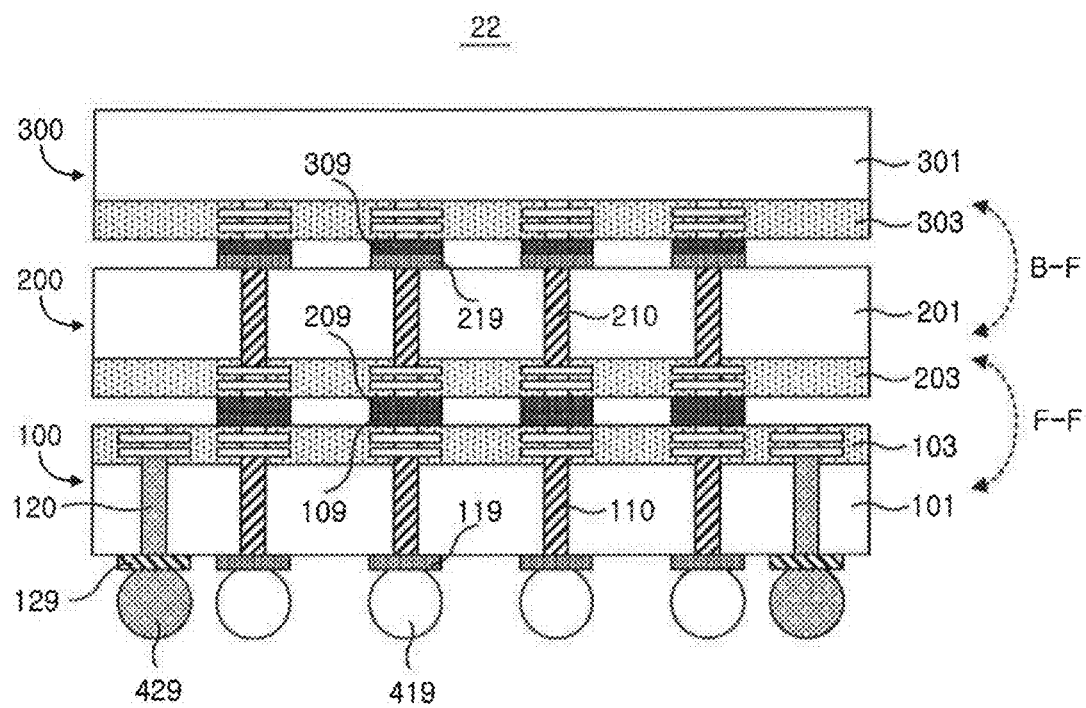
Figure 3J:
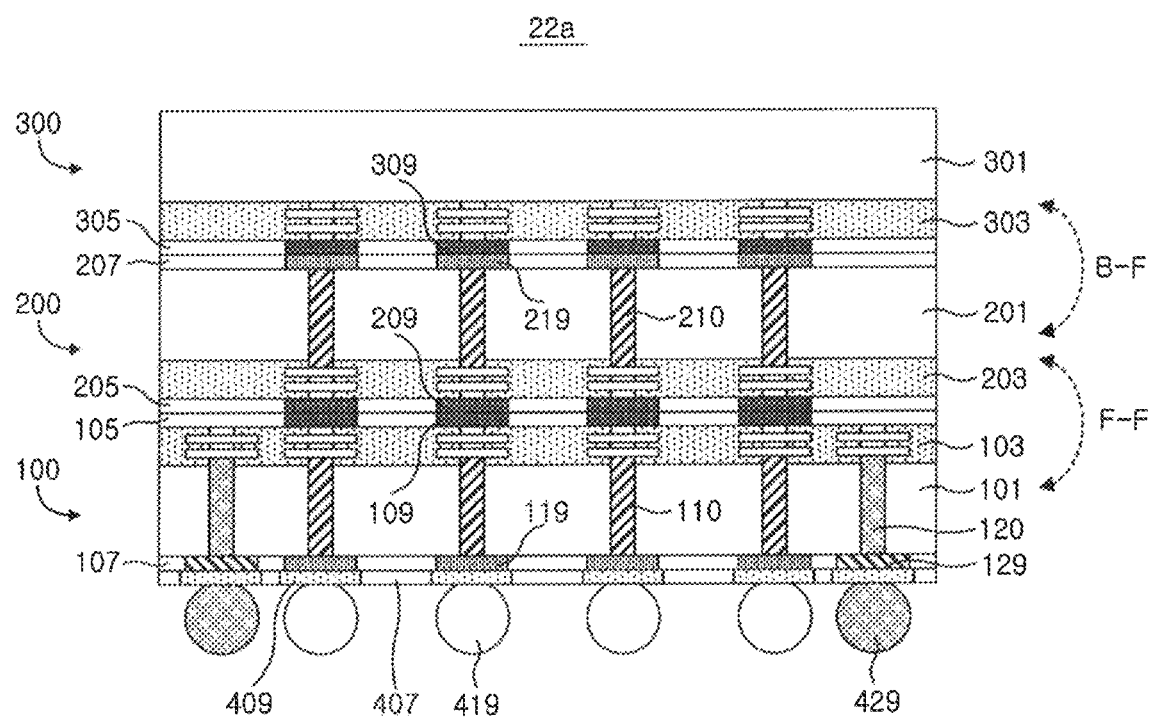

Referring to FIG. 3G, the wafer-level chip stack 912 may be divided into a plurality of chip-level semiconductor devices 12 by a dicing process. The semiconductor device 12 has a hybrid stacking structure. For example, the first and second semiconductor chips 100 and 200 constitutes the face-to-face structure F-F, and the second and third semiconductor chips 200 and 300 constitutes the back-to-face structure B-F. The first semiconductor chip 100 to which the interconnection terminals 419 are attached may serve as a master chip, and the second and third semiconductor chips 200 and 300 may serve as slave chips. For example, the first semiconductor chip 100 may be a logic chip as the master chip, and the second and third chips 200 and 300 may be memory chips as the slave chips.

Alternatively, the first to third semiconductor chips 100, 200 and 300 may be the same type chip such as a memory chip.

Referring to FIG. 3H, a semiconductor device 12a is substantially similar to the semiconductor device 12 of FIG. 3G, except that the semiconductor device 12a further includes at least one protection layer and an insulation layer.

For example, the first semiconductor chip 100 further includes a first front protection layer 105 and a first backside protection layer 107. The second semiconductor chip 200 further includes a second front protection layer 205 and a second backside protection layer 207. The third semiconductor chip 300 further includes a third front protection layer 305. The first to third front pads 109, 209 and 309 may be formed by a damascene process. Similarly, the second and second backside pads 119 and 219 may be formed by a damascene process.

The semiconductor device 12a further includes the insulation layer 407 which covers the first backside protection layer 107 and the metal layers 409 which is coupled to the first backside pads 119. The interconnection terminals 419 are coupled to the metal layers 409 and electrically connected to the first backside pads 119.

Referring to FIG. 3I, a semiconductor device 22 is substantially similar to the semiconductor device 12 of FIG. 3G, except that the semiconductor device 22 further includes a plurality of test electrodes 120. For example, the first semiconductor chip 100 further includes the plurality of test electrodes 120. The test electrodes 120 may be formed together with the first through-electrodes 110. The test electrodes 120 penetrates the first semiconductor substrate 101 and the first circuit layer 103.

The first semiconductor chip 100 has no pads on the first circuit layer 103. A plurality of test pads 129 is further formed on the backside surface of the first semiconductor substrate 101 to be connected to the test electrodes 120, and the test terminals 429 are further formed to be coupled to the test pads 129.

Referring to FIG. 3J, a semiconductor device 22a is substantially similar to the semiconductor device 12 of FIG. 3G, except that the semiconductor device 22a further includes the protection layers 105, 107, 205, 207 and 305 substantially identical or similar to those as illustrated in FIG. 3H. The first to third front pads 109, 209 and 309 may be formed by a damascene process. Similarly, the first and second backside pads 119 and 219 may be formed by a damascene process. The semiconductor device 22a further includes the insulation layer 407 which covers the first backside protection layer 107 and the metal layers 409 which are coupled to the first backside pads 119 and the test pads 129.

FIGS. 4A to 4E are cross-sectional views illustrating a method of fabricating a semiconductor device according to an exemplary embodiment of the present inventive concept. FIGS. 4F to 4H are cross-sectional views illustrating semiconductor devices as an alternative example to the semiconductor device 13 of FIG. 4E.

Figure 4A:
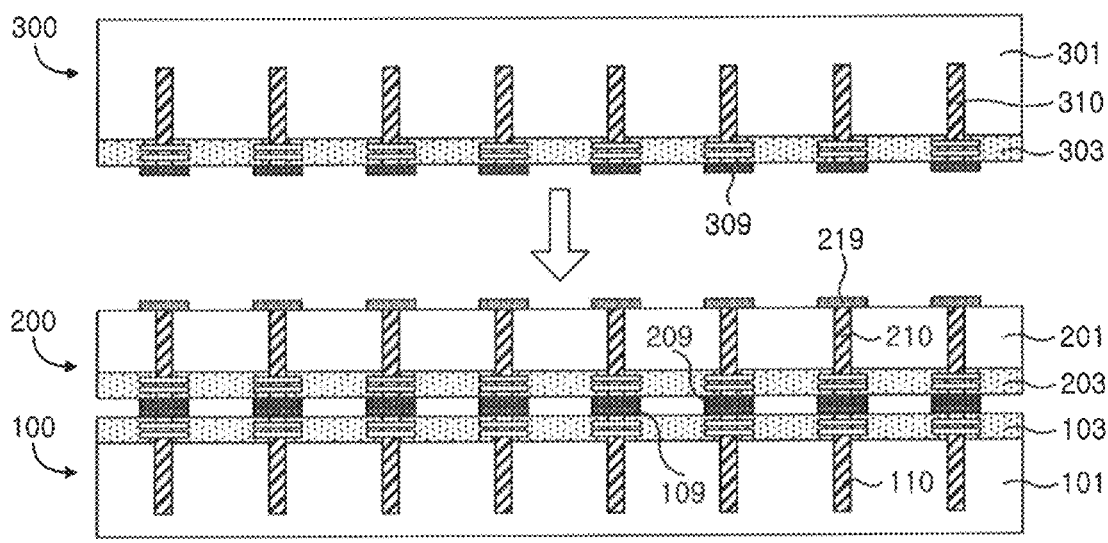
FIGS. 4A to 4E are cross-sectional views illustrating a method of fabricating a semiconductor device according to an exemplary embodiment of the present inventive concepts.

Referring to FIG. 4A, substantially identical or similar to features as illustrated in FIGS. 1A to 1E, the second wafer-level semiconductor chip 200 having the second through-electrodes 210 is stacked on the first wafer-level semiconductor chip 100 having the first through-electrodes 110 in the manner of the face-to-face configuration, and the third wafer-level semiconductor chip 300 having the third through-electrodes 310 is stacked on the second semiconductor chip 200 in the manner of the back-to-face configuration.

For example, as illustrated in FIGS. 1A and 1B, the second semiconductor chip 200 having the second through-electrodes 210 is stacked on the first semiconductor chip 100 having the first through-electrodes 110 to constitute the face-to-face structure. As illustrated in FIG. 1C, the backside surface of the second semiconductor substrate 201 may be grinded down to expose the second through-electrodes 210, and the backside surface of the first semiconductor substrate 101 may be grinded down without exposing the first through-electrodes 110. As illustrated in FIG. 1D, the second backside pads 219 are formed on the grinded backside surface of the second semiconductor substrate 201 to be electrically connected to the second through-electrodes 210. As illustrated in FIG. 1E, the third semiconductor chip 300 having the third through-electrodes 310 is stacked on the second semiconductor chip 200 to constitute the back-to-face structure.

Figure 4B:
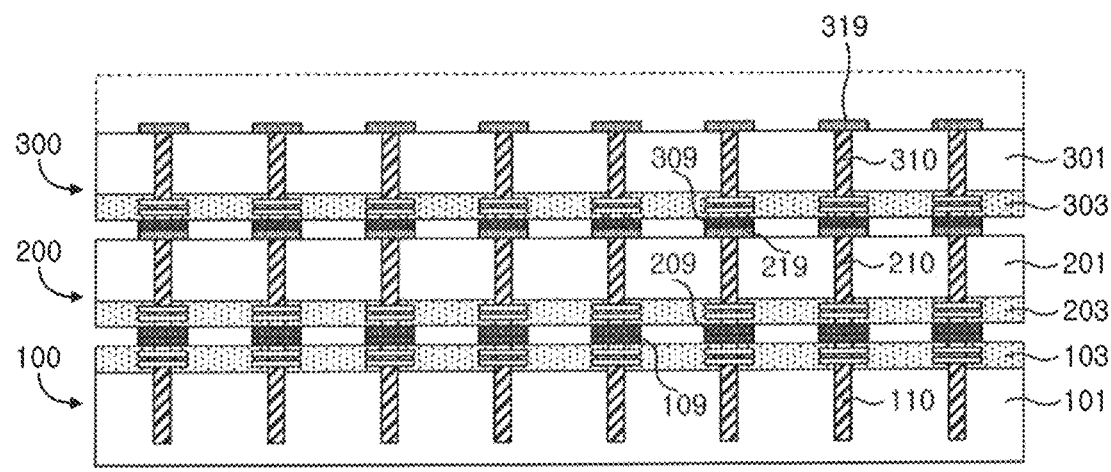

Referring to FIG. 4B, the backside surface of the third semiconductor substrate 301 may be grinded down to the extent that the third through-electrodes 310 may be exposed or protruded. The third backside pads 319 are formed on the grinded backside surface of the third semiconductor substrate 301 to be electrically connected to the third through-electrodes 310.

Figure 4C:
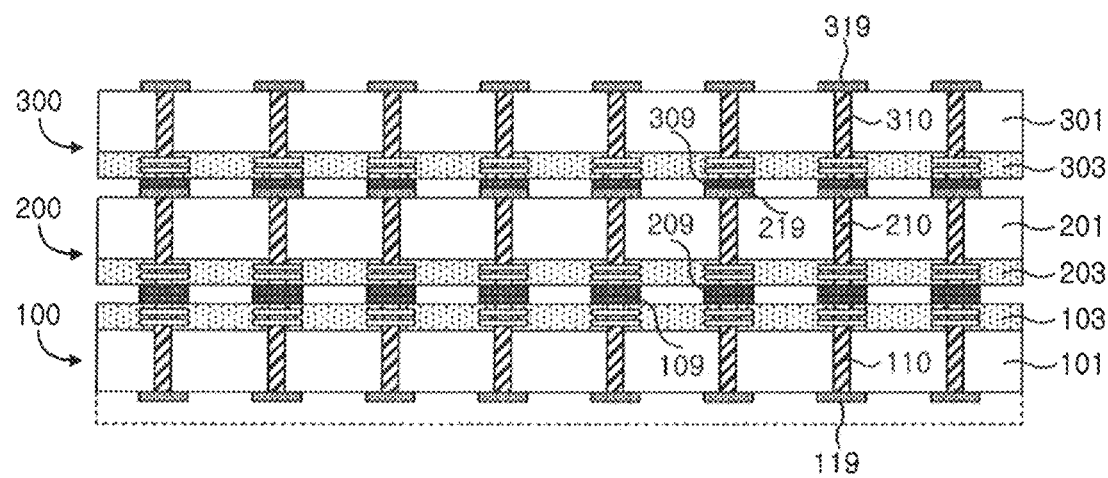

Referring to FIG. 4C, the backside surface of the first semiconductor substrate 101 may be further grinded down to the extent that the first through-electrodes 110 may be exposed or protruded from the grinded backside surface of the first semiconductor substrate 101. The first backside pads 119 are formed on the twice grinded backside surface of the first semiconductor substrate 101 to be electrically connected to the first through-electrodes 110.

Figure 4D:
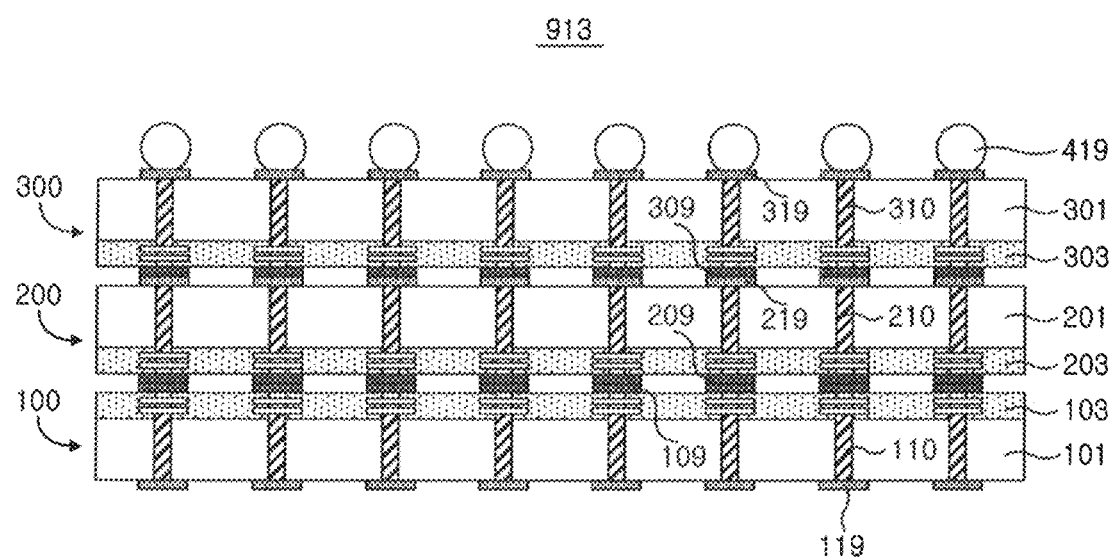

Referring to FIG. 4D, the interconnection terminals 419 are formed to fabricate a chip stack 913. The interconnection terminals 419 are coupled to the third backside pads 319 or the first backside pads 119. The interconnection terminals 419 are coupled to the third backside pads 319. At least one chip-level or wafer-level semiconductor chip may be stacked on the backside surface, on which the first backside pads 119 are formed, of the first semiconductor substrate 101.

Figure 4E:
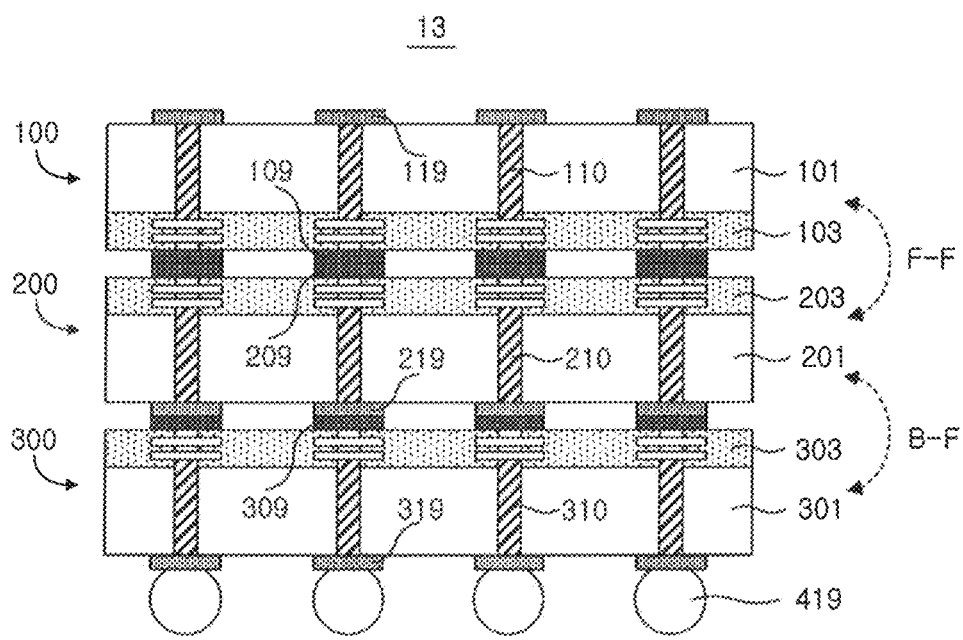
Figure 4F:
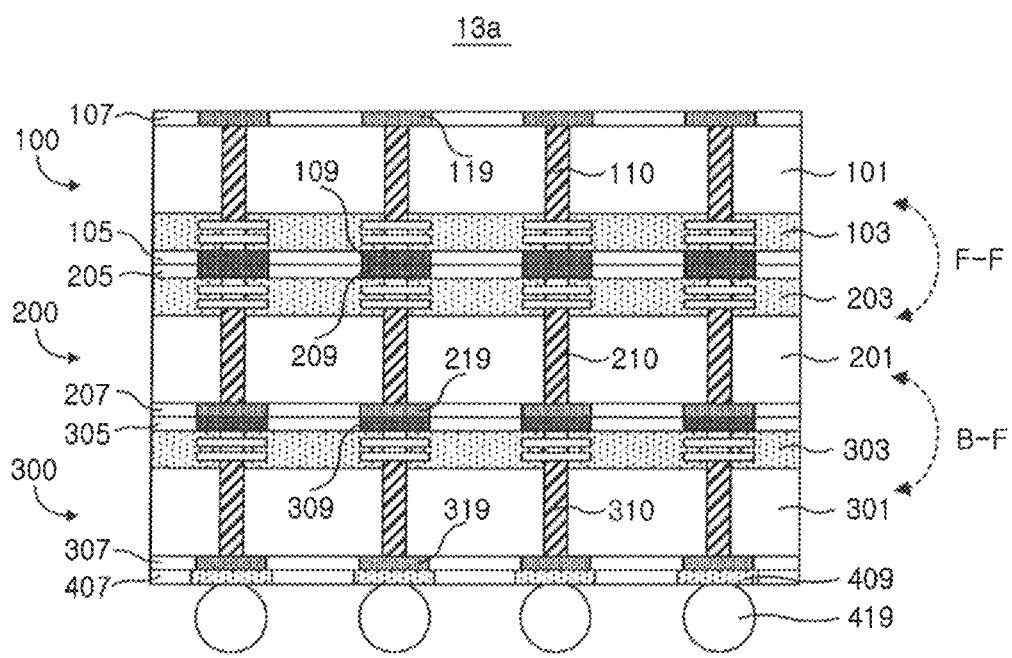
FIGS. 4F to 4H are cross-sectional views of semiconductor devices according to an exemplary embodiment of the present inventive concept.
Figure 4G:
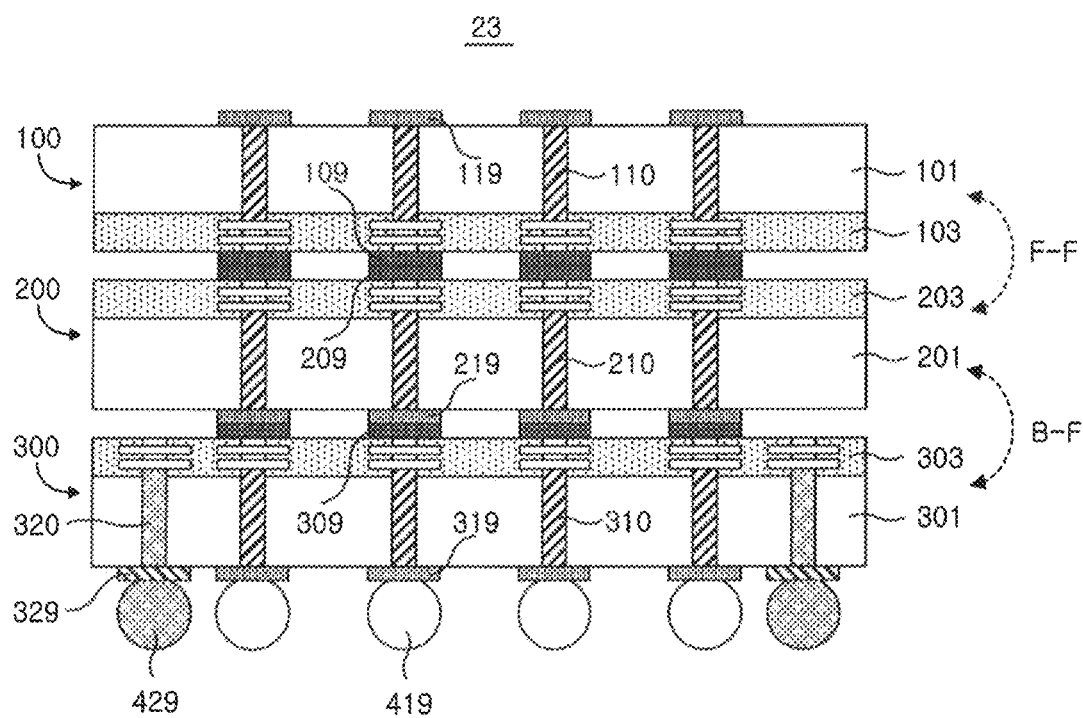
Figure 4H:
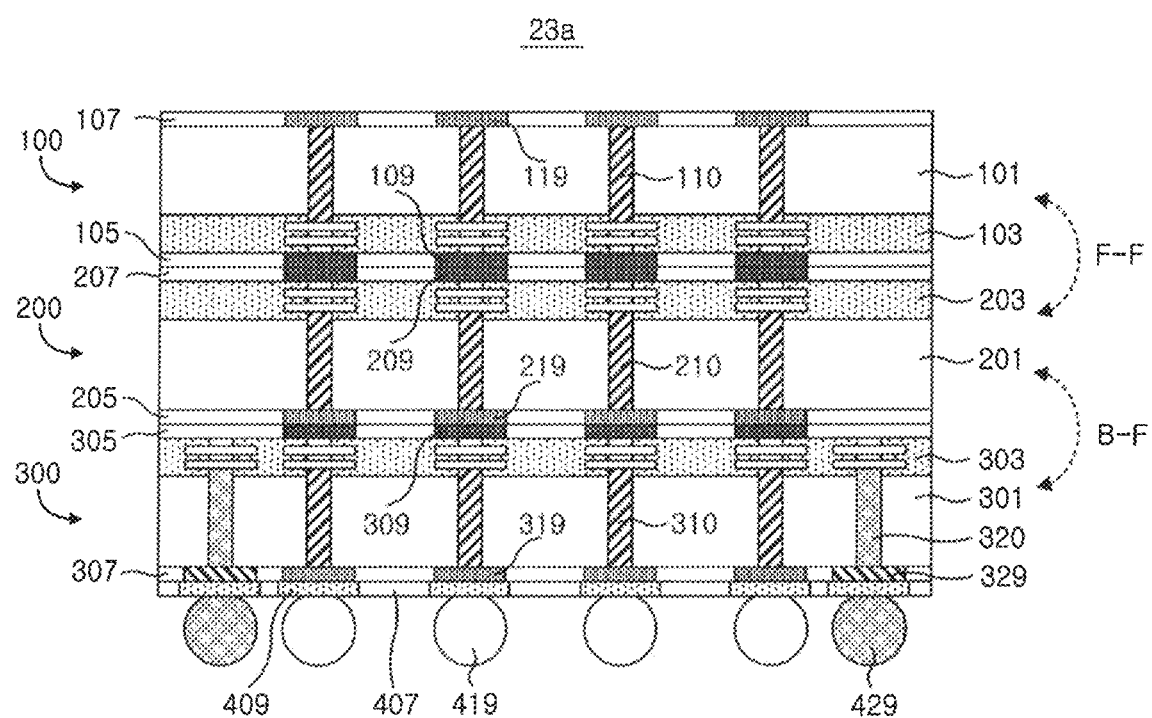

Referring to FIG. 4E, the chip stack 913 may be divided into a plurality of chip-level semiconductor devices 13 by a dicing process. The semiconductor device 13 has a hybrid stacking structure including the face-to-face structure F-F of the first and second semiconductor chips 100 and 200, and the back-to-face structure B-F of the second and third semiconductor chips 200 and 300. The third semiconductor chip 300 to which interconnection terminals 419 are attached may serve as a master chip, and the first and second semiconductor chips 100 and 200 may serve as slave chips. For example, the third semiconductor chip 300 may be a logic chip as the master chip, and the first and second semiconductor chips 100 and 200 may be memory chips as the slave chips.

Alternatively, the first to third semiconductor chips 100, 200 and 300 may be the same type chip such as a memory chip.

Referring to FIG. 4F, a semiconductor device 13a is substantially similar to the semiconductor device 13 of FIG. 4E, except that the semiconductor device 13a further includes protection layers. For the convenience of description, description of the same elements will be omitted. For example, the first semiconductor chip 100 further includes the first front protection layer 105 and the first backside protection layer 107. The second semiconductor chip 200 further includes the second front protection layer 205 and the second backside protection layer 207. The third semiconductor chip 300 further includes the third front protection layer 305 and the third backside protection layer 307. The first to third front pads 109, 209 and 309 may be formed by a damascene process. Similarly, the first to third backside pads 119, 219 and 319 may be formed by a damascene process. The semiconductor device 13a further includes the insulation layer 407 which covers the third backside protection layer 307 and the metal layers 409 which is coupled to the third backside pads 319.

Referring to FIG. 4G, a semiconductor device 23 is substantially similar to the semiconductor device 13 of FIG. 4E, except that the semiconductor device 23 further includes the test electrodes 320. For example, the third semiconductor chip 300 serving as the master chip further includes the test electrodes 320. The test pads 329 are further formed on the backside surface of the third semiconductor substrate 301 to be connected to the test electrodes 310, and the test terminals 429 are further formed to be coupled to the test pads 329.

Referring to FIG. 4H, a semiconductor device 23a is substantially similar to the semiconductor device 13 of FIG. 4E, except that the semiconductor device 23a further includes the protection layers 105, 107, 205, 207, 305 and 307 substantially identical or similar to those as illustrated in FIG. 4F and the insulation layer 407 covering the third backside protection layer 307 and the metal layers 409 which are coupled to the third backside pads 319 and the test pads 329.

Figure 5A:
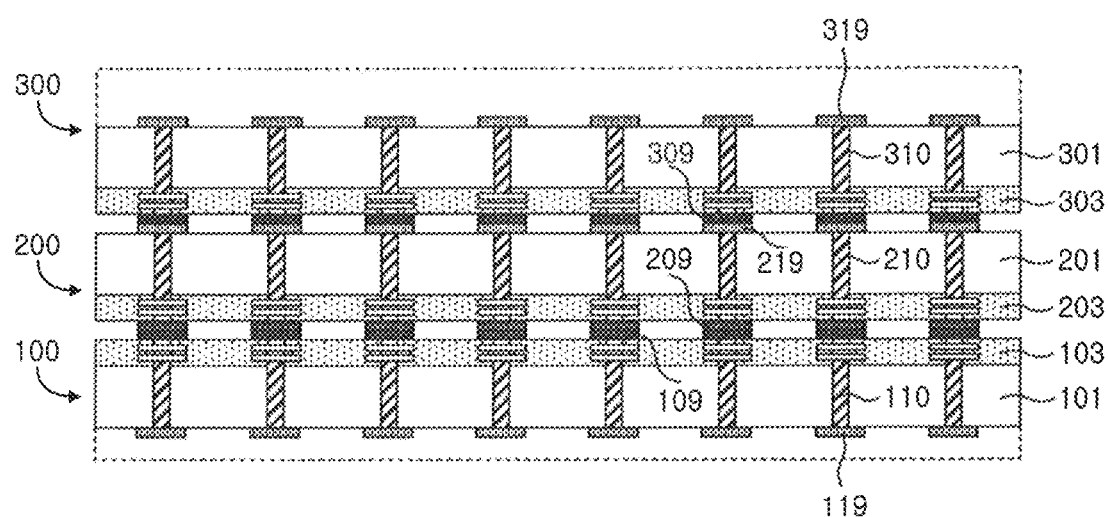
FIGS. 5A to 5C are cross-sectional views illustrating a method for fabricating a semiconductor device according to an exemplary embodiment of the present inventive concept.
Figure 5B:
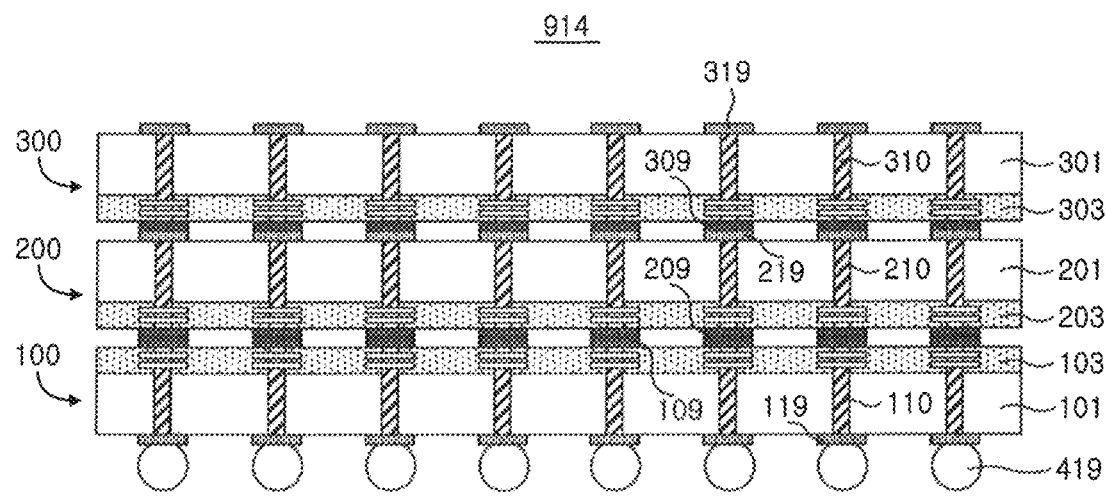
Figure 5C:
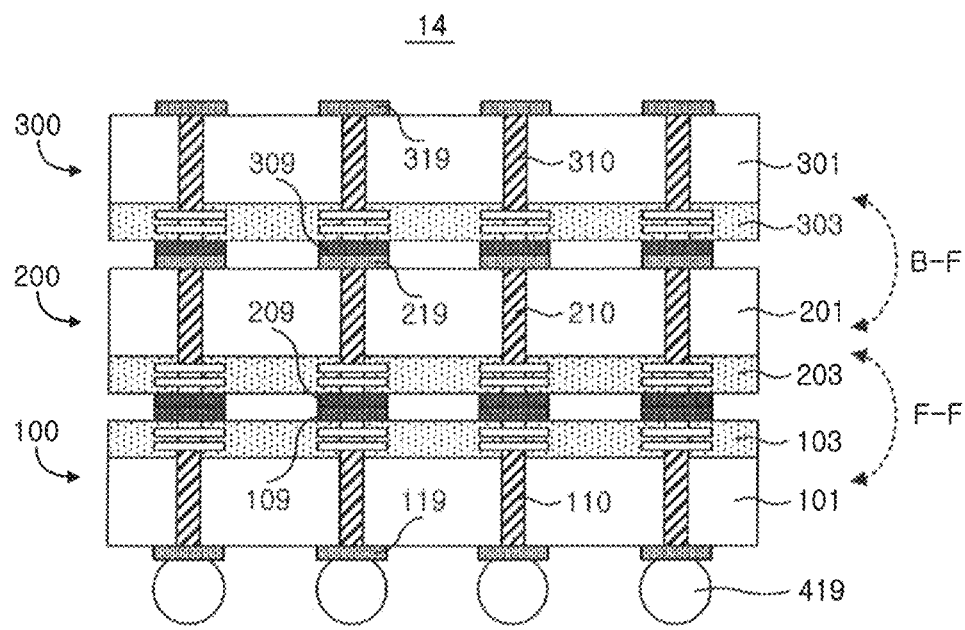
Figure 5D:
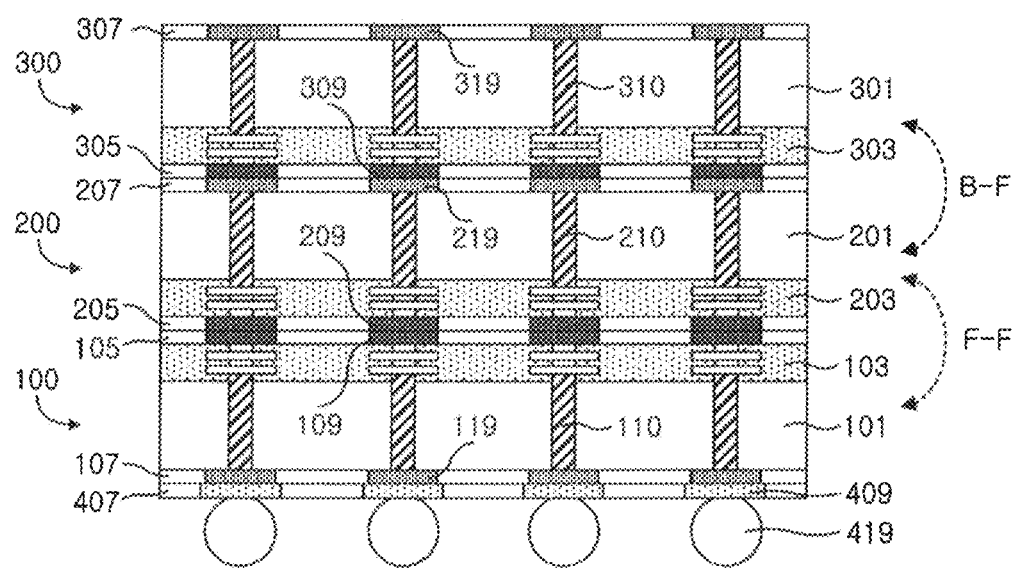
FIGS. 5D to 5F are cross-sectional views illustrating semiconductor devices according to an exemplary embodiment of the present inventive concept.
Figure 5E:
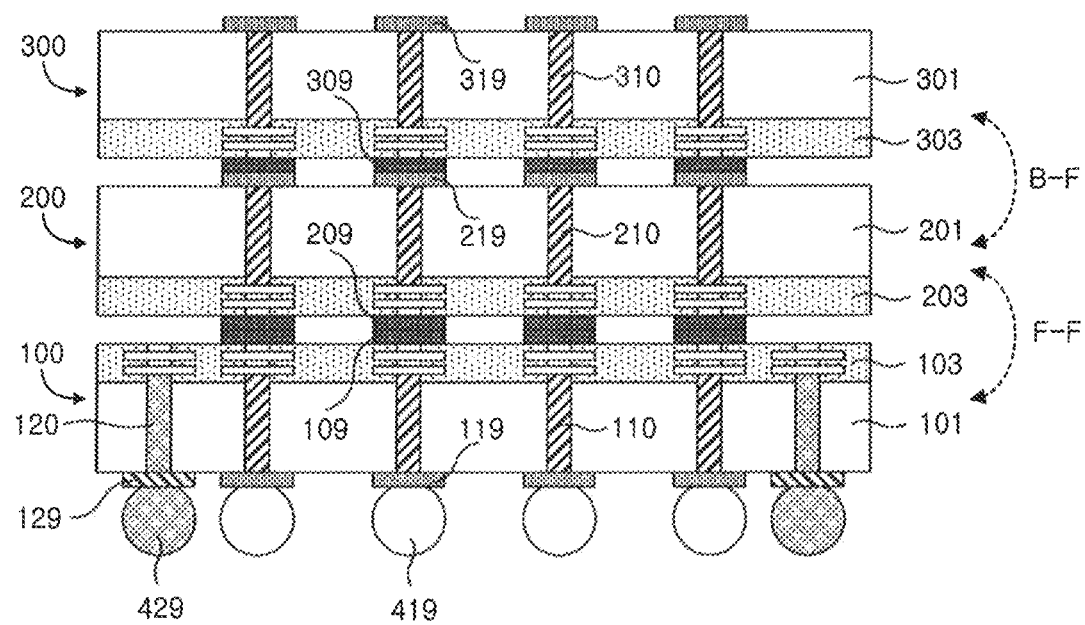
Figure 5F:
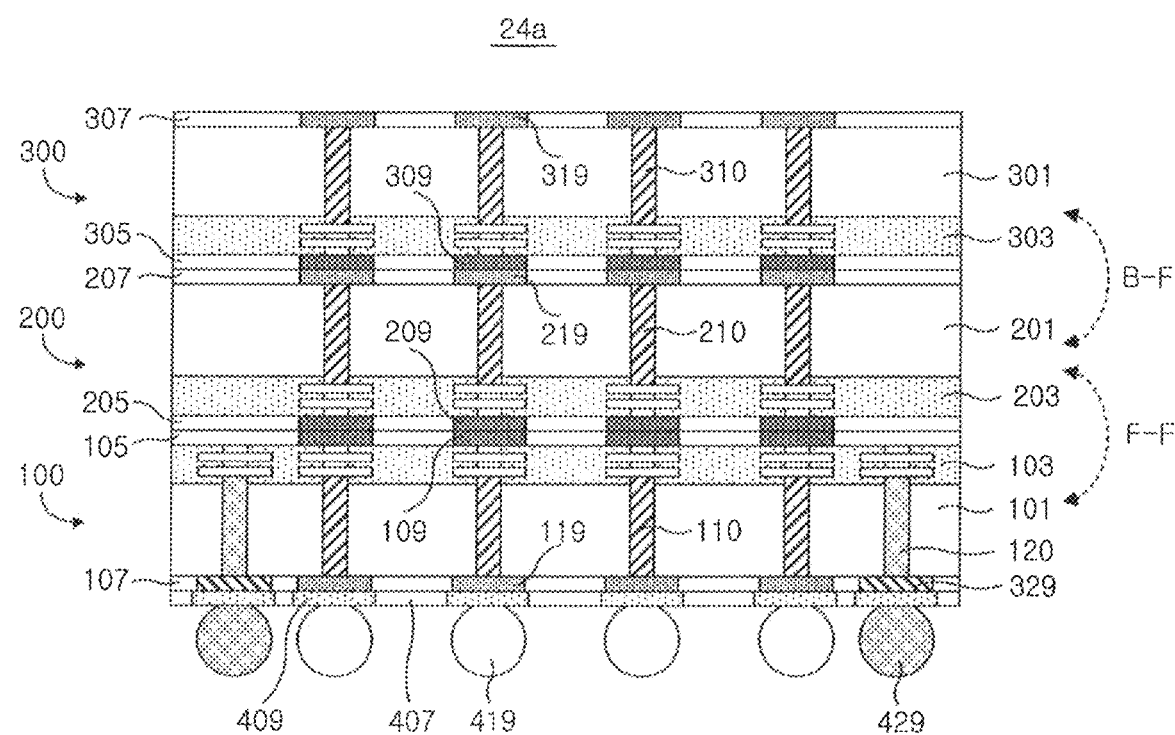

FIGS. 5A to 5C are cross-sectional views illustrating a method of fabricating a semiconductor device according to an exemplary embodiment of the present inventive concept. FIGS. 5D to 5F are cross-sectional views illustrating semiconductor devices as an alternative embodiment to the semiconductor device 14 of FIG. 5C.

Referring to FIG. 5A, substantially identical or similar to features as illustrated in FIGS. 4A to 4C, the first to third semiconductor chips 100, 200 and 300 are stacked on another. The backside surfaces of the first to third semiconductor substrates 101, 201 and 301 may be grinded down, and the first to third backside pads 119, 219 and 319 may be formed.

Referring to FIG. 5B, the interconnection terminals 419 coupled to the first backside pads 119 are further formed to fabricate a chip stack 914. At least one of chip-level semiconductor chip may be stacked on the backside surface, on which the third backside pads 319 are formed, of the third semiconductor substrate 301.

Referring to FIG. 5C, the chip stack 914 may be divided into a plurality of chip-level semiconductor devices 14 by a dicing process. The semiconductor device 14 has a hybrid structure including the face-to-face structure F-F of the first and second semiconductor chips 100 and 200, and the back-to-face structure B-F of the second and third semiconductor chips 200 and 300. The first semiconductor chip 100 to which the interconnection terminals 419 are attached may serve as a master chip, and the second and third semiconductor chips 200 and 300 may serve as slave chips. For example, the first semiconductor chip 100 may be a logic chip as the master chip, and the second and third semiconductor chips 200 and 300 may be memory chips as the slave chips.

Alternatively, the first to third semiconductor chips 100, 200 and 300 may be the same type chip such as a memory chip.

Referring to FIG. 5D, a semiconductor device 14a is substantially similar to the semiconductor device 14 of FIG. 5C, except that the semiconductor device 14a further includes the protection layers 105, 107, 205, 207, 305 and 307 substantially identical or similar to those as illustrated in FIG. 4F, and the insulation layer 407 covering the first backside protection layer 107 and the metal layers 409 which is coupled to the first backside pads 119.

Referring to FIG. 5E, a semiconductor device 24 is substantially similar to the semiconductor device 14 of FIG. 5C, except that the semiconductor device 24 further includes the test electrodes 120. For example, the first semiconductor chip 100 serving as the master chip further includes the test electrodes 120. The test pads 129 are further formed on the backside surface of the first semiconductor substrate 101 to be connected to the test electrodes 120, and the test terminals 429 are further formed to be coupled to the test pads 129.

Referring to FIG. 5F, a semiconductor device 24a is substantially similar to the semiconductor device 14 of FIG. 5C, except that the semiconductor device 24a further includes the protection layers 105, 107, 205, 207, 305 and 307 substantially identical or similar to those as illustrated in FIG. 5D, and the insulation layer 407 covering the first backside protection layer 107 and the metal layers 409 which are connected to the first backside pads 119 and the test pads 329.

Figure 6A:
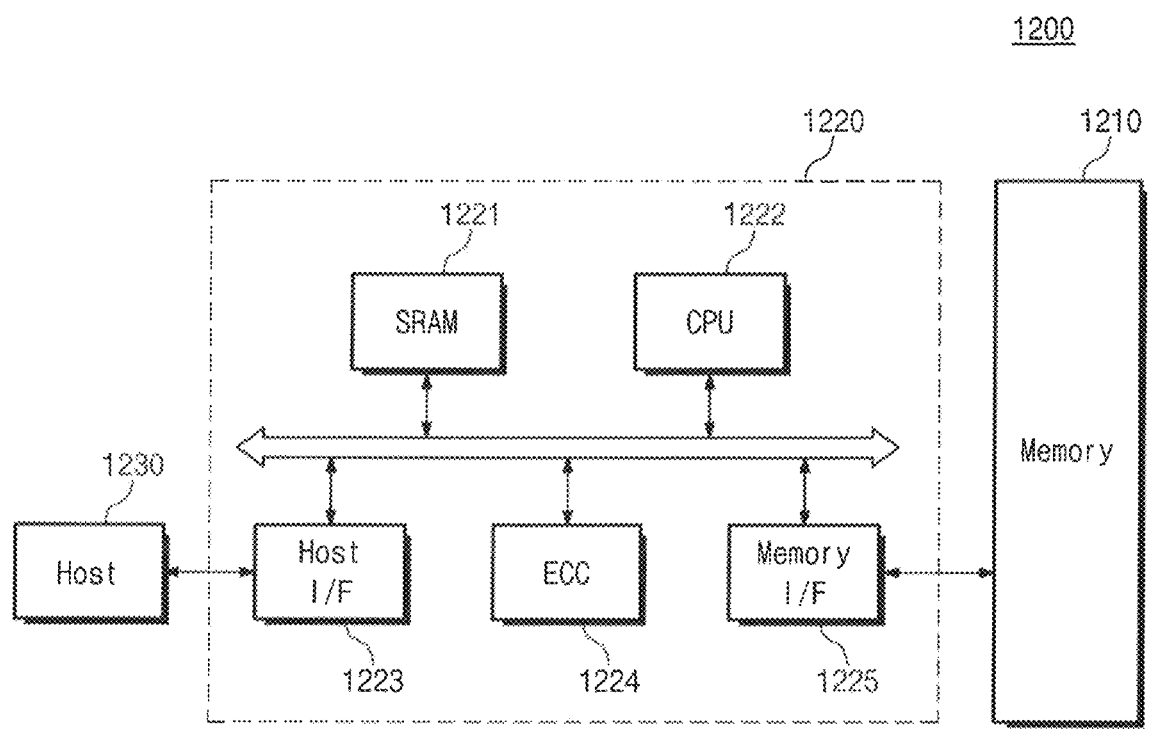
FIG. 6A is a schematic block diagram illustrating an exemplary memory card including a semiconductor device according to an exemplary embodiment of the present inventive concepts.
Figure 6B:
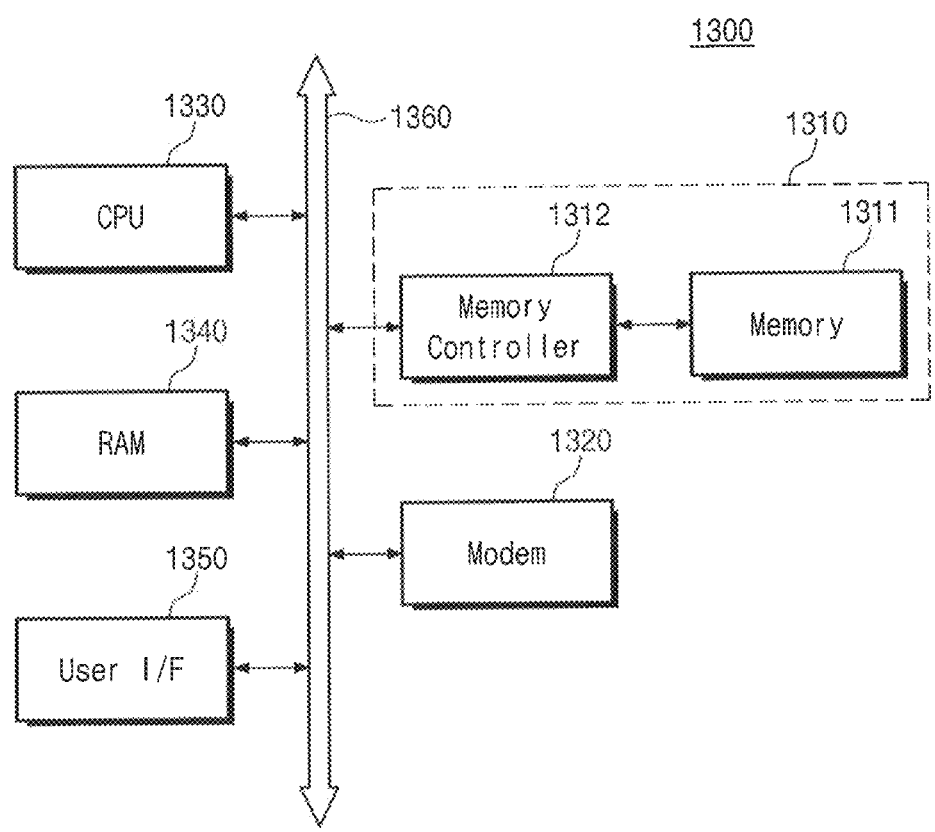
FIG. 6B is a schematic block diagram illustrating an exemplary information process system including a semiconductor device according to an exemplary embodiment of the present inventive concept.

FIG. 6A is a schematic block diagram illustrating an exemplary memory card including a semiconductor device according to an exemplary embodiment of the present inventive concept. FIG. 6B is a schematic block diagram illustrating an exemplary information process system including a semiconductor device according to an exemplary embodiment of the present inventive concept.

Referring to FIG. 6A, a memory card 1200 includes a memory 1210 and a memory controller 1220. The memory 1210 may include at least one semiconductor device according to an exemplary embodiment of the inventive concept. The memory controller 1220 may control data exchange between a host 1230 and the memory 1210. A static random access memory (SRAM) device 1221 may serve as a work memory of a central processing unit 1222. A host interface 1223 may have a data exchange protocol of a host connected to the memory card 1200. An error correction coding block 1224 may detect and correct errors of data that are read from the memory 1210. A memory interface 1225 may interface the memory 1210. The central processing unit 1222 may control data exchange of the memory controller 1220. The central processing unit 1222 may include at least one semiconductor device according to an exemplary embodiment of the inventive concept.

Referring to FIG. 6B, an information processing system 1300 includes a memory system 1310 having at least one semiconductor device according to an exemplary embodiment of the inventive concept. The information processing system 1300 may include a mobile device or a computer. For example, the information processing system 1300 may include a modem 1320, a central processing unit 1330, a RAM 1340, and a user interface 1350 electrically connected to the memory system 1310 via a system bus 1360. The memory 1310 may include a memory 1311 and a memory controller 1312 and have substantially the same configuration as that of the memory card 1200 in FIG. 6A. The memory system 1310 may store data processed by the central processing unit 1330 or data input from the outside. The information process system 1300 may be provided as a memory card, a solid state disk, a semiconductor device disk, a camera image sensor, or other application chipsets. For example, the memory system 1310 may be used as a portion of a solid state drive (SSD), and in this case, the information processing system 1300 may store a large amount of data in the memory system 1310.

According to an exemplary embodiment of the present inventive concept, when the second semiconductor chip is stacked on the first semiconductor chip, the second semiconductor chip is grinded down and the first semiconductor chip is further grinded down to the extent that the stacking thickness of the semiconductor chips is applicable to various semiconductor processing equipments. It is possible to realize a semiconductor device having a minimum thickness, which minimizes the thickness of a semiconductor product. Further, a smaller stacking thickness of semiconductor chips may become compatible with processing equipments and improve productivity. Moreover, test terminals are formed for electric inspection, which increase yield and electrical characteristics of the semiconductor device.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, the method comprising:
stacking a first semiconductor chip and a second semiconductor chip,
wherein the first semiconductor chip includes a first front surface, a first backside surface opposite to the first front surface and a first circuit layer adjacent to the first front surface, and the second semiconductor chip includes a second front surface, a second backside surface opposite to the second front surface, a second circuit layer adjacent to the second front surface and a through-electrode which is electrically coupled to the second circuit layer and spaced apart from the second backside surface, and
wherein the first front surface and the second front surface face each other;
grinding the second backside surface to expose the through-electrode of the second semiconductor chip;
grinding the first backside surface to reduce the first semiconductor chip to a first reduced thickness;
stacking a third semiconductor chip on the grinded second backside surface,
wherein the third semiconductor chip includes a third front surface, a third backside surface opposite to the third front surface and a third circuit layer adjacent to the third front surface,
wherein the third front surface and the grinded second backside surface face each other;
grinding the third backside surface to reduce a thickness of the third semiconductor chip; and
grinding the grinded first backside surface to reduce the first semiconductor chip to a second reduced thickness, wherein the second reduced thickness is smaller than the first reduced thickness,
wherein the second semiconductor chip comprises the through-electrode partially penetrating the second semiconductor chip,
wherein the grinding of the first backside surface is performed before the stacking of the third semiconductor chip, and
wherein the grinding of the grinded first backside surface is performed after the stacking of the third semiconductor chip.

2. The method of claim 1,
wherein the third semiconductor chip further comprises a through-electrode that is spaced apart from the third backside surface and is electrically coupled to the third circuit layer,
wherein the through-electrode of the third semiconductor chip is exposed by grinding the third backside surface.

3. The method of claim 2, further comprising:
forming a pad on the grinded third backside surface to be electrically coupled to the through-electrode of the third semiconductor chip; and
forming an interconnection terminal on the pad to be electrically coupled to the through-electrode of the third semiconductor chip.

4. The method of claim 3,
wherein the third semiconductor chip further comprises a test through-electrode that is spaced apart from the third backside surface and is electrically coupled to the third circuit layer, wherein the test through-electrode of the third semiconductor chip is exposed by grinding the third backside surface.

5. The method of claim of claim 4, further comprising:
forming a test pad on the grinded third backside surface to be electrically coupled to the test through-electrode; and forming a test terminal on the test pad to be electrically coupled to the test through-electrode.

6. The method of claim 1,
wherein the first semiconductor chip further comprises a through-electrode that is spaced apart from the first backside surface and is electrically coupled to the first circuit layer,
wherein the through-electrode of the first semiconductor chip is exposed by the grinding of the grinded first backside surface.

7. The method of claim 6, further comprising:
forming a pad on the exposed through-electrode of the first semiconductor chip; and
forming an interconnection terminal on the pad to be electrically coupled to the through-electrode of the first semiconductor chip.

8. The method of claim 1,
wherein the first semiconductor chip further comprises a through-electrode that is spaced apart from the first backside surface and is electrically coupled to the first circuit layer,
wherein the through-electrode of the first semiconductor chip is exposed by the grinding of the grinded first backside surface,
wherein the third semiconductor chip further comprises a through-electrode that is spaced apart from the third backside surface and is electrically coupled to the third circuit layer, and
wherein the through-electrode of the third semiconductor chip is exposed by grinding the third backside surface.

9. The method of claim 8, further comprising:
forming a first pad on the exposed through-electrode of the third semiconductor chip;
forming a second pad on the exposed through-electrode of the first semiconductor chip; and
forming an interconnection terminal on the first pad to be electrically coupled to the through-electrode of the third semiconductor chip.

10. The method of claim 8, further comprising:
forming a first pad on the exposed through-electrode of the third semiconductor chip;
forming a second pad on the exposed through-electrode of the first semiconductor chip; and
forming an interconnection terminal on the second pad to be electrically coupled to the through-electrode of the first semiconductor chip.

11. A method of fabricating a semiconductor device, the method comprising:
providing a first semiconductor chip and a second semiconductor chip each having a front surface and a backside surface opposite to the front surface, wherein the first and second semiconductor chips are stacked such that corresponding front surfaces face each other;
grinding the backside surface of the second semiconductor chip to reduce a thickness thereof;
grinding the backside surface of the first semiconductor chip to reduce the first semiconductor chip to a first reduced thickness;
grinding the grinded backside surface of the first semiconductor chip to reduce the first semiconductor chip to a second reduced thickness, wherein the second reduced thickness is smaller than the first reduced thickness;
providing a third semiconductor chip on the grinded backside surface of the second semiconductor chip, the third semiconductor chip having a front surface and a backside surface opposite to the front surface thereof, wherein the third semiconductor chip is stacked such that the front surface of the third semiconductor chip faces the grinded backside surface of the second semiconductor chip; and
grinding the backside surface of the third semiconductor chip to reduce a thickness thereof,
wherein the grinding of the backside surface of the first semiconductor chip is performed before the stacking of the third semiconductor chip, and
wherein the grinding of the grinded backside surface of the first semiconductor chip is performed after the stacking of the third semiconductor chip.

12. The method of claim 11,
wherein providing a first semiconductor chip and a second semiconductor chip comprises:
directly contacting the front surface of the first semiconductor chip with the front surface of the second semiconductor chip.

13. The method of claim 11,
wherein the providing of the third semiconductor chip on the grinded backside surface of the second semiconductor chip comprises:
directly contacting the front surface of the third semiconductor chip with the grinded backside surface of the second semiconductor chip.

14. The method of claim 11,
wherein the first semiconductor chip further comprises a through-electrode that is spaced apart from the backside surface of the first semiconductor chip and is electrically coupled to a circuit layer of the first semiconductor chip, and
wherein the through-electrode of the first semiconductor chip is exposed by grinding the backside surface of the first semiconductor chip.

15. The method of claim 14, further comprising:
forming a pad on the grinded backside surface of the first semiconductor chip to be electrically coupled to the through-electrode of the first semiconductor chip; and
forming an interconnection terminal on the pad to be electrically coupled to the through-electrode of the first semiconductor chip.

16. The method of claim 15,
wherein the first semiconductor chip further comprises a test through-electrode that is spaced apart from the backside surface of the first semiconductor chip and is electrically coupled to the circuit layer of the first semiconductor chip, and
wherein the test through-electrode of the first semiconductor chip is exposed by grinding the backside surface of the first semiconductor chip.

17. The method of claim of claim 16, further comprising:
forming a test pad on the grinded backside surface of the first semiconductor chip to be electrically coupled to the test through-electrode; and
forming a test terminal on the test pad to be electrically coupled to the test through-electrode.

\* \* \* \* \*